United States Patent
Hsu et al.

(10) Patent No.: US 12,346,027 B2
(45) Date of Patent: Jul. 1, 2025

(54) METHODS OF MAKING A SEMICONDUCTOR DEVICE

(71) Applicant: Taiwan Semiconductor Manufacturing Company, Ltd., Hsinchu (TW)

(72) Inventors: Pei-Cheng Hsu, Hsinchu (TW);
Ching-Huang Chen, Hsinchu (TW);
Hung-Yi Tsai, Hsinchu (TW);
Ming-Wei Chen, Hsinchu (TW);
Hsin-Chang Lee, Hsinchu (TW);
Ta-Cheng Lien, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/745,236

(22) Filed: Jun. 17, 2024

(65) Prior Publication Data

US 2024/0337917 A1    Oct. 10, 2024

Related U.S. Application Data

(60) Continuation of application No. 18/214,348, filed on Jun. 26, 2023, now Pat. No. 12,044,960, which is a division of application No. 17/556,681, filed on Dec. 20, 2021, now Pat. No. 11,726,399, which is a continuation of application No. 16/744,732, filed on Jan. 16, 2020, now Pat. No. 11,204,545.

(51) Int. Cl.
*G03F 7/20* (2006.01)
*G03F 1/24* (2012.01)

(52) U.S. Cl.
CPC .............. *G03F 7/2004* (2013.01); *G03F 1/24* (2013.01)

(58) Field of Classification Search
CPC .................................. G03F 1/24; G03F 7/2004

USPC ............................................................ 430/5
See application file for complete search history.

(56) References Cited

U.S. PATENT DOCUMENTS

| | | | |
|---|---|---|---|
| 8,546,047 | B2 | 10/2013 | Hosoya |
| 9,239,515 | B2 | 1/2016 | Hayashi |
| 2013/0260292 | A1 | 10/2013 | Yamazaki et al. |
| 2014/0363633 | A1 | 12/2014 | Kim et al. |
| 2015/0261083 | A1 | 9/2015 | Sakai et al. |
| 2018/0031965 | A1 | 2/2018 | Jindal |
| 2019/0146331 | A1 | 5/2019 | Lin et al. |
| 2019/0384157 | A1 | 12/2019 | Ikebe et al. |

FOREIGN PATENT DOCUMENTS

| | | |
|---|---|---|
| DE | 102006046000 A1 | 8/2007 |
| DE | 102014222028 A1 | 7/2015 |
| JP | 2019-086802 A | 6/2019 |
| JP | 2019-527382 A | 9/2019 |
| KR | 10-2014-0144610 A | 12/2014 |
| KR | 10-2015-0059615 A | 6/2015 |
| TW | I472872 B | 2/2015 |
| TW | 201830122 A | 8/2018 |

OTHER PUBLICATIONS

Peter Hones et al., "Structural and mechanical properties of chromium nitride, molybdenum nitride, and tungsten nitride thin films," Journal of Physics: Applied Physics 36 (2003) 1023-1029.
Notice of Allowance issued in U.S. Appl. No. 16/744,732, dated Aug. 10, 2021.
Notice of Allowance issued in U.S. Appl. No. 18/214,348, dated Mar. 13, 2024.

*Primary Examiner* — Christopher G Young
(74) *Attorney, Agent, or Firm* — STUDEBAKER BRACKETT PLLC

(57) ABSTRACT

A reflective mask includes a substrate, a reflective multilayer disposed on the substrate, a capping layer disposed on the reflective multilayer, and an absorber layer disposed on the capping layer. The absorber layer includes one or more alternating pairs of a first Cr based layer and a second Cr based layer different from the first Cr based layer.

20 Claims, 24 Drawing Sheets

METHODS OF MAKING A SEMICONDUCTOR DEVICE

RELATED APPLICATIONS

This application is a continuation of U.S. patent application Ser. No. 18/214,348 filed Jun. 26, 2023, which is a division of U.S. patent application Ser. No. 17/556,681 filed Dec. 20, 2021, now U.S. Pat. No. 11,726,399, which is a continuation of U.S. patent application Ser. No. 16/744,732 filed Jan. 16, 2020, now U.S. Pat. No. 11,204,545, the entire content of each of which is incorporated herein by reference.

BACKGROUND

Photolithography operations are one of the key operations in the semiconductor manufacturing process. Photolithography techniques include ultraviolet lithography, deep ultraviolet lithography, and extreme ultraviolet lithography (EUVL). The photo mask is an important component in photolithography operations. It is critical to fabricate EUV photo masks having a high contrast with a high reflectivity part and a high absorption part.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

Embodiments of the present disclosure provide a method of manufacturing an EUV photo mask. More specifically, the present disclosure provides techniques to prevent or suppress damage on a backside conductive layer of an EUV photo mask.

EUV lithography (EUVL) employs scanners using light in the extreme ultraviolet (EUV) region, having a wavelength of about 1 nm to about 100 nm, for example, 13.5 nm. The mask is a critical component of an EUVL system. Because the optical materials are not transparent to EUV radiation, EUV photo masks are reflective masks. Circuit patterns are formed in an absorber layer disposed over the reflective structure. The absorber has a low EUV reflectivity, for example, less than 3-5%.

The present disclosure provides an EUV reflective photo mask having a low reflective (high absorbing) absorber structure.

Figure 1:
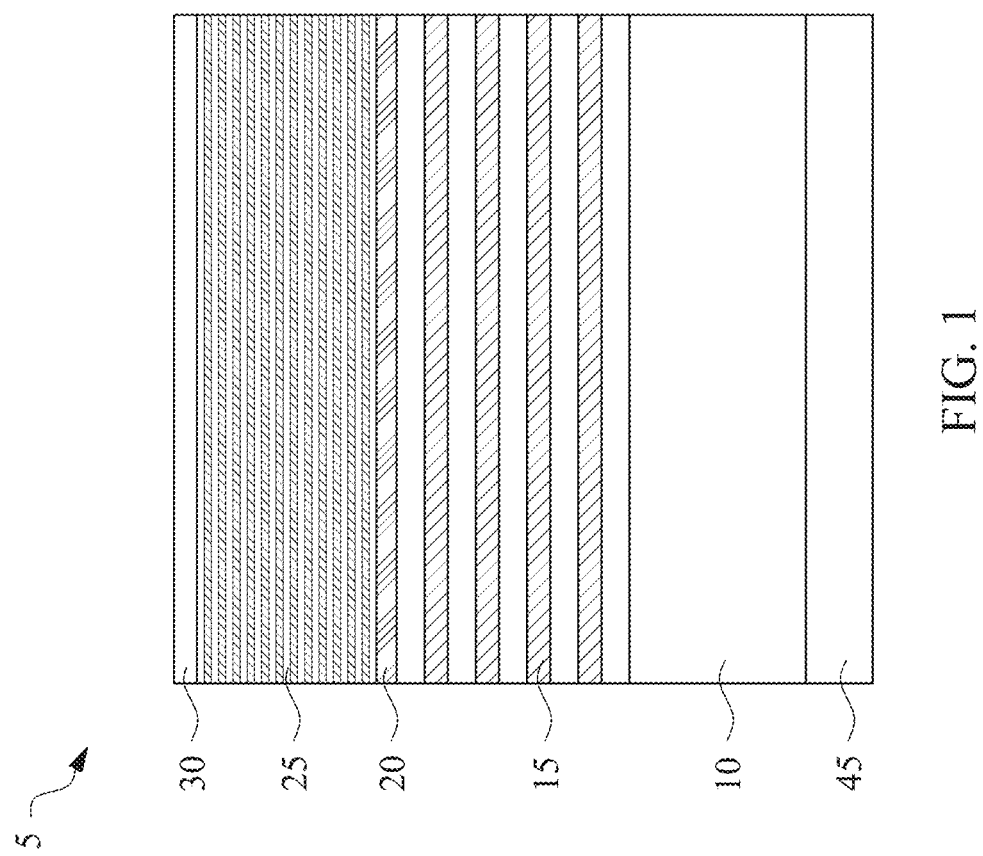
FIG. 1 shows a EUV photo mask blank according to an embodiment of the present disclosure.

FIG. 1 shows an EUV reflective photo mask blank according to an embodiment of the present disclosure. In some embodiments, the EUV photo mask with circuit patterns is formed from a EUV photo mask blank 5. The EUV photo mask blank 5 includes a substrate 10, a multilayer Mo/Si stack 15 of multiple alternating layers of silicon and molybdenum, a capping layer 20, an absorber layer 25 and a hard mask layer 30. Further, a backside conductive layer 45 is formed on the backside of the substrate 10, as shown in FIG. 1.

The substrate 10 is formed of a low thermal expansion material in some embodiments. In some embodiments, the substrate is a low thermal expansion glass or quartz, such as fused silica or fused quartz. In some embodiments, the low thermal expansion glass substrate transmits light at visible wavelengths, a portion of the infrared wavelengths near the visible spectrum (near-infrared), and a portion of the ultraviolet wavelengths. In some embodiments, the low thermal expansion glass substrate absorbs extreme ultraviolet wavelengths and deep ultraviolet wavelengths near the extreme ultraviolet. In some embodiments, the size of the substrate 10 is 152 mm×152 mm having a thickness of about 20 mm.

In some embodiments, the Mo/Si multilayer stack 15 includes from about 30 alternating layers each of silicon and molybdenum to about 60 alternating layers each of silicon and molybdenum. In certain embodiments, from about 40 to about 50 alternating layers each of silicon and molybdenum are formed. In some embodiments, the reflectivity is higher than about 70% for wavelengths of interest e.g., 13.5 nm. In some embodiments, the silicon and molybdenum layers are formed by chemical vapor deposition (CVD), plasma-enhanced CVD (PECVD), atomic layer deposition (ALD), physical vapor deposition (PVD) (sputtering), or any other suitable film forming method. Each layer of silicon and molybdenum is about 2 nm to about 10 nm thick. In some embodiments, the layers of silicon and molybdenum are about the same thickness. In other embodiments, the layers of silicon and molybdenum are different thicknesses. In some embodiments, the thickness of each silicon layer is about 4 nm and the thickness of each molybdenum layer is about is about 3 nm.

In other embodiments, the multilayer stack 15 includes alternating molybdenum layers and beryllium layers. In some embodiments, the number of layers in the multilayer stack 15 is in a range from about 20 to about 100 although any number of layers is allowed as long as sufficient reflectivity is maintained for imaging the target substrate. In some embodiments, the reflectivity is higher than about 70% for wavelengths of interest e.g., 13.5 nm. In some embodiments, the multilayer stack 15 includes about 30 to about 60 alternating layers of Mo and Be. In other embodiments of the present disclosure, the multilayer stack 15 includes about 40 to about 50 alternating layers each of Mo and Be.

The capping layer 20 is disposed over the Mo/Si multilayer 15 to prevent oxidation of the multilayer stack 15 in some embodiments. In some embodiments, the capping layer 20 is made of ruthenium, a ruthenium alloy (e.g., RuB, RuSi or RuNb) or a ruthenium oxide (e.g., $RuO_2$ or RuNbO), having a thickness of from about 2 nm to about 10 nm. In certain embodiments, the thickness of the capping layer 20 is from about 2 nm to about 4 nm. In some embodiments, the capping layer 20 has a thickness of 3.5 nm±10%. In some embodiments, the capping layer 20 is formed by chemical vapor deposition, plasma-enhanced chemical vapor deposition, atomic layer deposition, physical vapor deposition (e.g., sputtering), or any other suitable film forming method. In other embodiments, a Si layer is used as the capping layer 20.

The absorber layer 25 is disposed over the capping layer 20. In embodiments of the present disclosure, the absorber layer 25 has a multilayered structure as described below. In other embodiments, the absorber layer 25 includes a layer of Co, Te, Hf and/or Ni or alloys thereof.

In some embodiments, an antireflective layer (not shown) is optionally disposed over the absorber layer 25. The antireflective layer is made of a silicon oxide in some embodiments, and has a thickness of from about 2 nm to about 10 nm. In other embodiments, a TaBO layer having a thickness in a range from about 12 nm to about 18 nm is used as the antireflective layer. In some embodiments, the thickness of the antireflective layer is from about 3 nm to about 6 nm. In some embodiments, the antireflective layer is formed by chemical vapor deposition, plasma-enhanced chemical vapor deposition, atomic layer deposition, physical vapor deposition, or any other suitable film forming method.

The hard mask layer 30 is disposed over the absorbing layer 25 in some embodiments. The hard mask layer 30 is formed over the antireflective layer in some embodiments. In some embodiments, the hard mask layer 30 is made of a Ta based material, such as TaB, TaO, TaBO or TaBN. In other embodiments, the hard mask layer 30 is made of silicon, a silicon-based compound (e.g., SiN or SiON), ruthenium-based compound (Ru or RuB). The hard mask layer 30 has a thickness of about 4 nm to about 20 nm. In some embodiments, the hard mask layer 30 is formed by chemical vapor deposition, plasma-enhanced chemical vapor deposition, atomic layer deposition, physical vapor deposition, or any other suitable film forming method.

In some embodiments, the backside conductive layer 45 is disposed on a second main surface of the substrate 10 opposing the first main surface of the substrate 10 on which the Mo/Si multilayer 15 is formed. In some embodiments, the backside conductive layer 45 is made of TaB (tantalum boride) or other Ta based conductive material. In some embodiments, the tantalum boride is crystal. The crystalline tantalum boride includes TaB, $Ta_5B_6$, $Ta_3B_4$ and $TaB_2$. In other embodiments, the tantalum boride is poly crystal or amorphous. In other embodiments, the backside conductive layer 45 is made of a Cr based conductive material (CrN or CrON). In some embodiments, sheet resistance of the backside conductive layer 45 is equal to or smaller than 20Ω/□. In certain embodiments, the sheet resistance of the backside conductive layer 45 is equal to or more than 0.1Ω/□. In some embodiments, surface roughness Ra of the backside conductive layer 45 is equal to or smaller than 0.25 nm. In certain embodiments, the surface roughness Ra of the backside conductive layer 45 is equal to or more than 0.05 nm. Further, in some embodiments, the flatness of the backside conductive layer 45 is equal to or less than 50 nm (within the EUV photo mask). In some embodiments, the flatness of the backside conductive layer 45 is more than 1 nm. A thickness of the backside conductive layer 45 is in a range from about 50 nm to about 400 nm in some embodiments. In other embodiments, the backside conductive layer 45 has a thickness of about 50 nm to about 100 nm. In certain embodiments, the thickness is in a range from about 65 nm to about 75 nm. In some embodiments, the backside conductive layer 45 is formed by atmospheric chemical vapor deposition (CVD), low pressure CVD, plasma-enhanced CVD, laser-enhanced CVD, atomic layer deposition (ALD), molecular beam epitaxy (MBE), physical vapor deposition including thermal deposition, pulsed laser deposition, electron-beam evaporation, ion beam assisted evaporation and sputtering, or any other suitable film forming method. In cases of CVD, source gases include $TaCl_5$ and $BCl_3$ in some embodiments.

FIGS. 2A-2G schematically illustrate a method of fabricating an EUV photo mask 5 for use in extreme ultraviolet lithography (EUVL). It is understood that additional operations can be provided before, during, and after processes shown by FIGS. 2A-2G, and some of the operations described below can be replaced or eliminated, for additional embodiments of the method. The order of the operations/processes may be interchangeable.

In the fabrication of an EUV photo mask 5, a first photoresist layer 35 is formed over the hard mask layer 30 of the EUV photo mask blank, and the photoresist layer 35 is selectively exposed to actinic radiation. Before the first photoresist layer 35 is formed, the EUV photo mask blank is subject to inspection. The selectively exposed first photoresist layer 35 is developed to form a pattern 40 in the first photoresist layer 35. In some embodiments, the actinic radiation is an electron beam or an ion beam. In some embodiments, the pattern 40 corresponds to a pattern of semiconductor device features for which the EUV photo mask 5 will be used to form in subsequent operations.

Figure 2A:
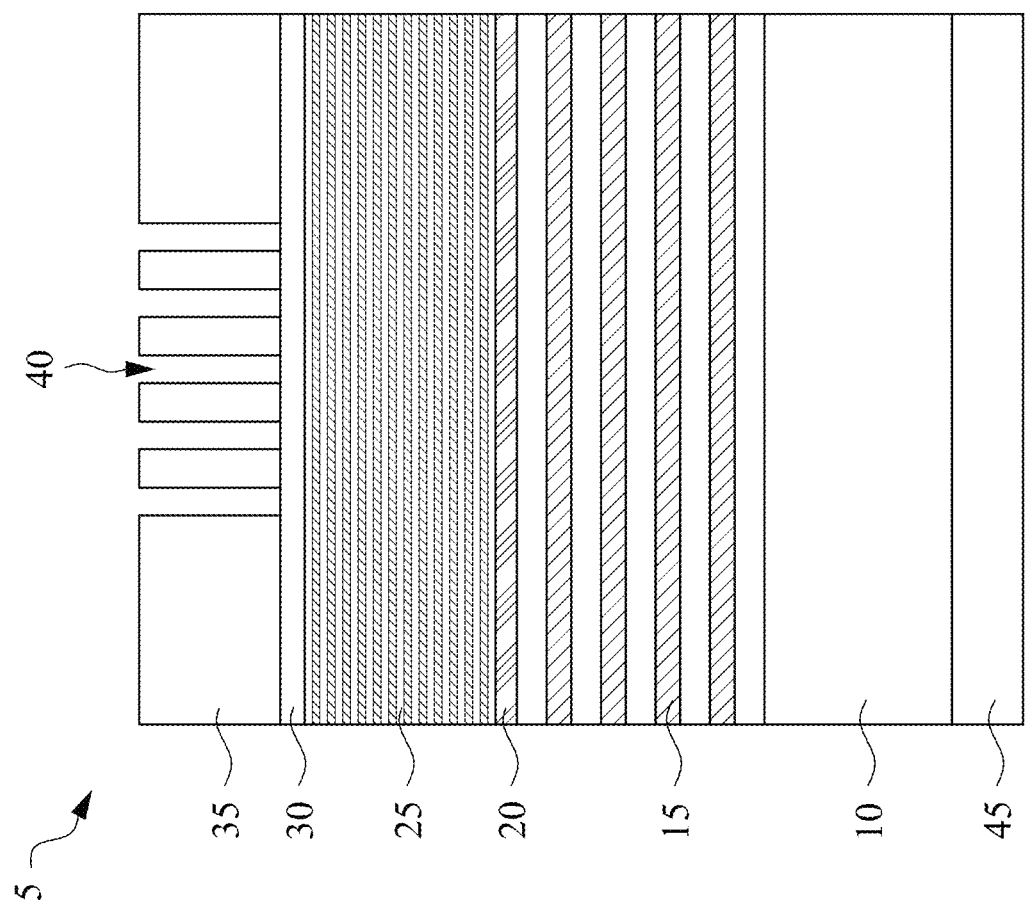
FIGS. 2A, 2B, 2C, 2D, 2E, 2F and 2G schematically illustrate a method of fabricating an EUV photo mask according to an embodiment of the present disclosure.
Figure 2C:
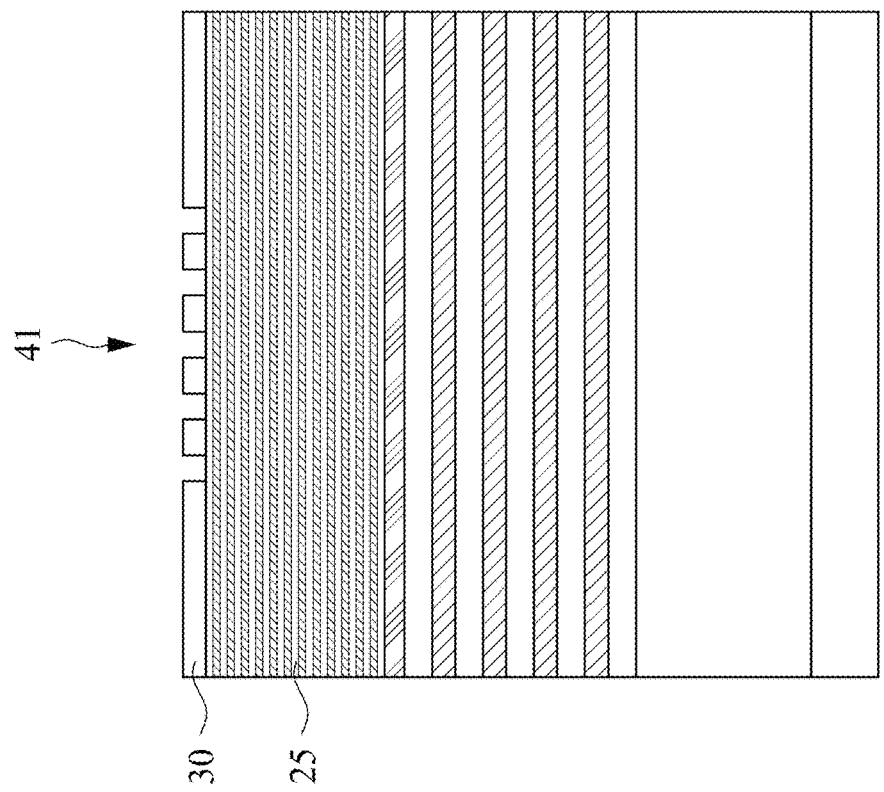
Figure 2B:
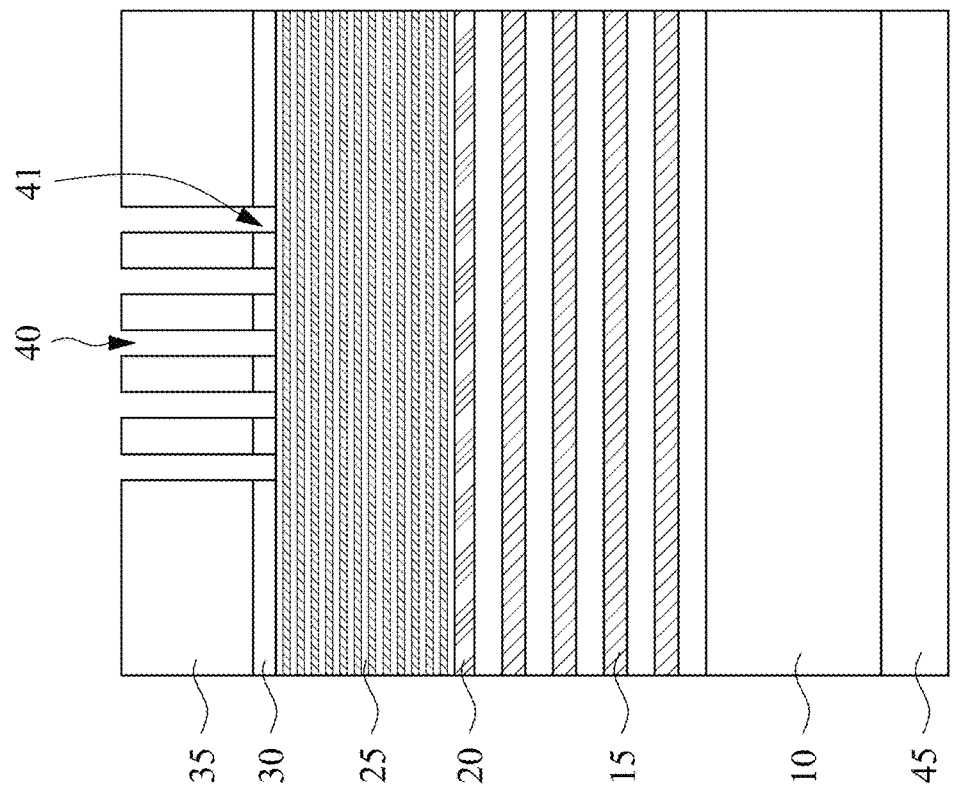

Next, the pattern 40 in the first photoresist layer 35 is extended into the hard mask layer 30 forming a pattern 41 in the hard mask layer 30 exposing portions of the absorber layer 25, as shown in FIG. 2B. The pattern 41 extended into the hard mask layer 30 is formed by etching, in some embodiments, using a suitable wet or dry etchant that is selective to the hard mask layer 30. After the pattern 41 by the hard mask layer 30 is formed, the first photoresist layer 35 is removed by a photoresist stripper to expose the upper surface of the hard mask layer 30, as shown in FIG. 2C.

Figure 2E:
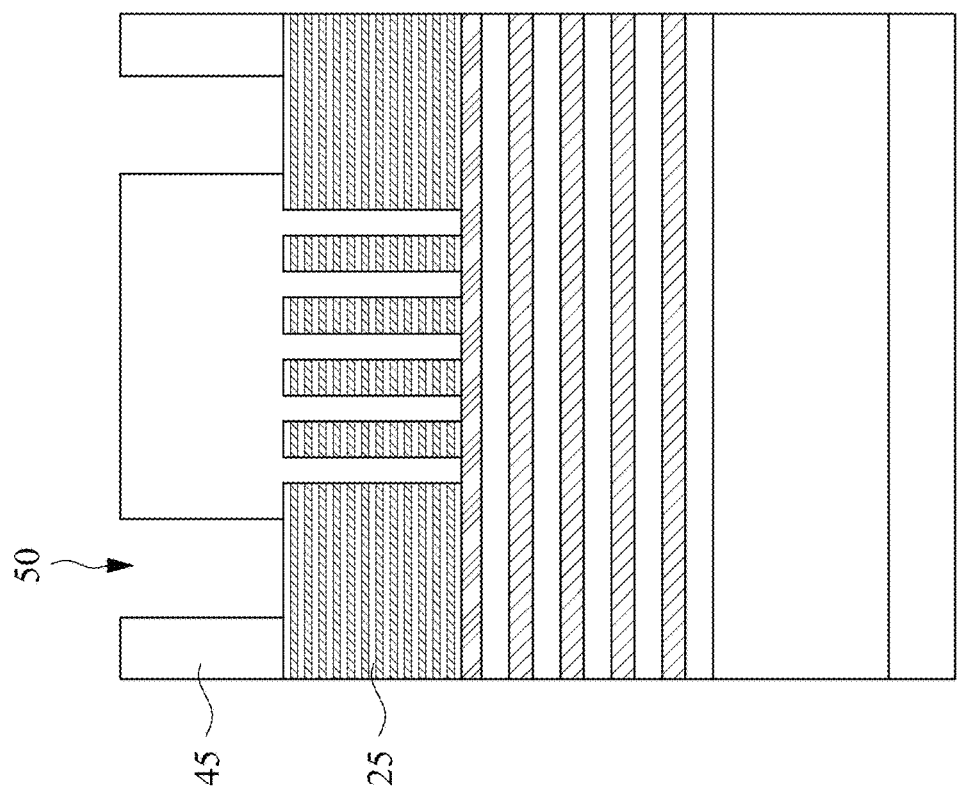
Figure 2D:
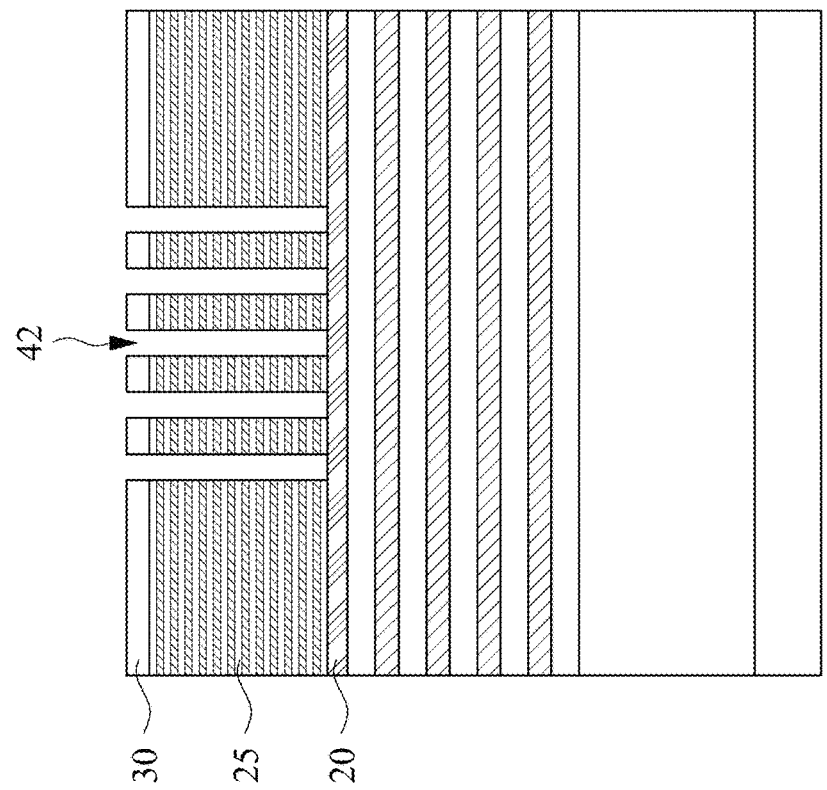

Then, the pattern 41 in the hard mask layer 30 is extended into the absorber layer 25 forming a pattern 42 in the absorber layer 25 exposing portions of the capping layer 20, as shown in FIG. 2D. The pattern 42 extended into the absorber layer 25 is formed by etching, in some embodiments, using a suitable wet or dry etchant that is selective to the absorber layer 25. In some embodiments, plasma dry etching is used.

As shown in FIG. 2E, a second photoresist layer 45 is formed over the absorber layer 25 filling the pattern 42 in the absorber layer 25. The second photoresist layer 45 is selectively exposed to actinic radiation such as electron beam or UV radiation. The selectively exposed second photoresist layer 45 is developed to form a pattern 50 in the second photoresist layer 45. The pattern 50 corresponds to a black border surrounding the circuit patterns. A black border is a frame shape area created by removing all the multilayers on the EUV photo mask in the region around a circuit pattern area. It is created to prevent exposure of adjacent fields when printing an EUV photo mask on a wafer. The width of the black border is in a range from about 1 mm to about 5 mm in some embodiments.

Figure 2G:
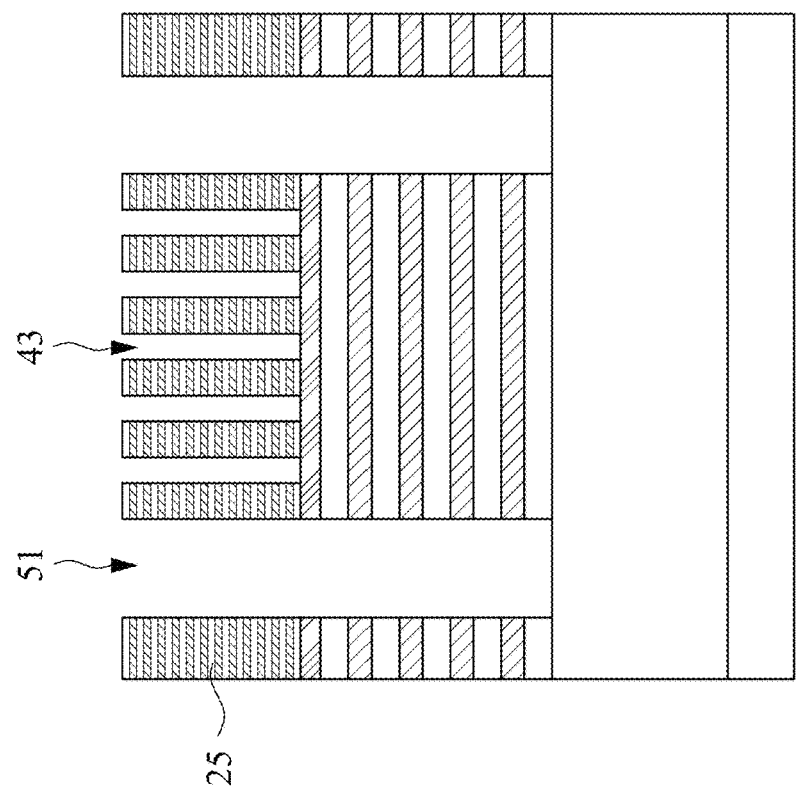
Figure 2F:
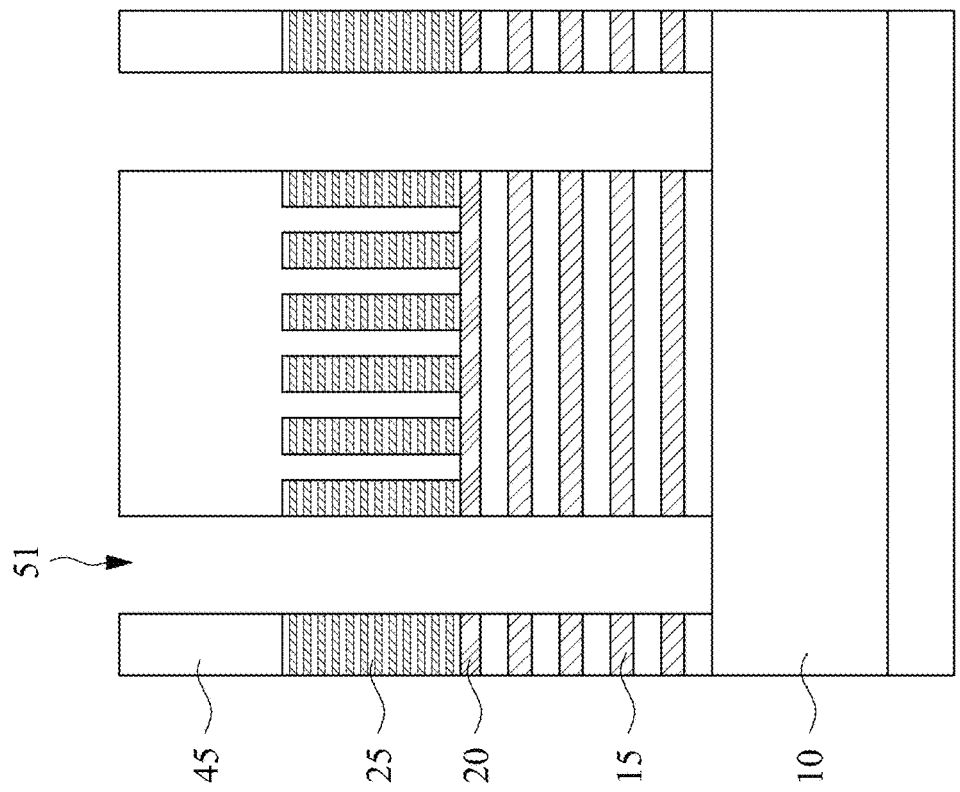

Next, the pattern 50 in the second photoresist layer 45 is extended into the absorber layer 25, capping layer 20, and Mo/Si multilayer 15 forming a pattern 51 in the absorber layer 25, capping layer 20, and Mo/Si multilayer 15 exposing portions of the substrate 10, as shown in FIG. 2F. The pattern 51 is formed by etching, in some embodiments, using one or more suitable wet or dry etchants that are selective to each of the layers that are etched. In some embodiments, plasma dry etching is used.

Then, the second photoresist layer 45 is removed by a suitable photoresist stripper to expose the upper surface of the absorber layer 25. The pattern 51 in the absorber layer 25, capping layer 20, and the Mo/Si multilayer 15 defines a black border of the photo mask 5 in some embodiments of the disclosure, as shown in FIG. 2G. After removal of the second photoresist layer, the photo mask 5 undergoes a cleaning operation, inspection, and the photo mask 5 is repaired as necessary, to provide a finished photo mask 5.

FIGS. 3A, 3B, 3C and 3D show cross sectional views of EUV photo masks according to embodiments of the present disclosure.

In the present disclosure, the absorber layer 25 has a multilayer structure having a first layer 120 and a second layer 125, which are alternately stacked. In some embodiments, the absorber layer 25 includes one or more alternating pairs of a first Cr based layer as the first layer 120 and a second Cr based layer as the second layer 125. In some embodiments, the first Cr based layer is CrN, and the second Cr based layer is CrON. In some embodiments, the ratio of O and N in the CrON is in a range from about 0.2:0.8 to about 0.8:0.2. In other embodiments, the ratio of O and N in the CrON is in a range from about 0.4:0.6 to about 0.6:0.4. In some embodiments, the amount of O (atomic percentage) is equal to or greater than the amount of N, and in other embodiments, the amount of O is smaller than the amount of N. In some embodiments, the first Cr based layer is $Cr_xNi_{1-x}N$. In some embodiments, $0 \leq x < 0.5$ and in other embodiments, $0.5 \leq x \leq 1.0$. In some embodiments, the CrN material is a pure CrN or a mixture of $Cr_2N$ and CrN. Generally, $Cr_2N$ is harder than CrN and thus has a lower etching rate than CrN. The composition of the CrN layer can be changed by changing one or more film formation conditions, such as a nitrogen flow rate.

In some embodiments, the first layer is TaCo, and the second layer is TaCoO. In some embodiments, the first layer is Hf, and the second layer is hafnium oxide.

In some embodiments, the first layer 120 and the second layer 125 are amorphous.

In some embodiments, the number of pairs of the first layer 120 and the second layer 125 is two to six. In other embodiments, the number of pairs is three, four or five. In certain embodiments, the number is three. In some embodiments, the absorber layer 25 includes a bottom absorber layer 110 disposed between the capping layer 20 and the pairs of the first layer 120 and the second layer 125. In some embodiments, the bottom absorber layer 110 is a Ta based layer including TaB, TaO, TaBO and/or TaBN. In certain embodiments, the bottom absorber layer 110 is TaBO. A thickness of the bottom absorber layer 110 is in a range from about 0.5 nm to about 5 nm in some embodiments, and is in a range from about 1 nm to about 3 nm in other embodiments. In some embodiments, the bottom absorber layer 110 has a thickness of 2 nm±10%.

Figure 3A:
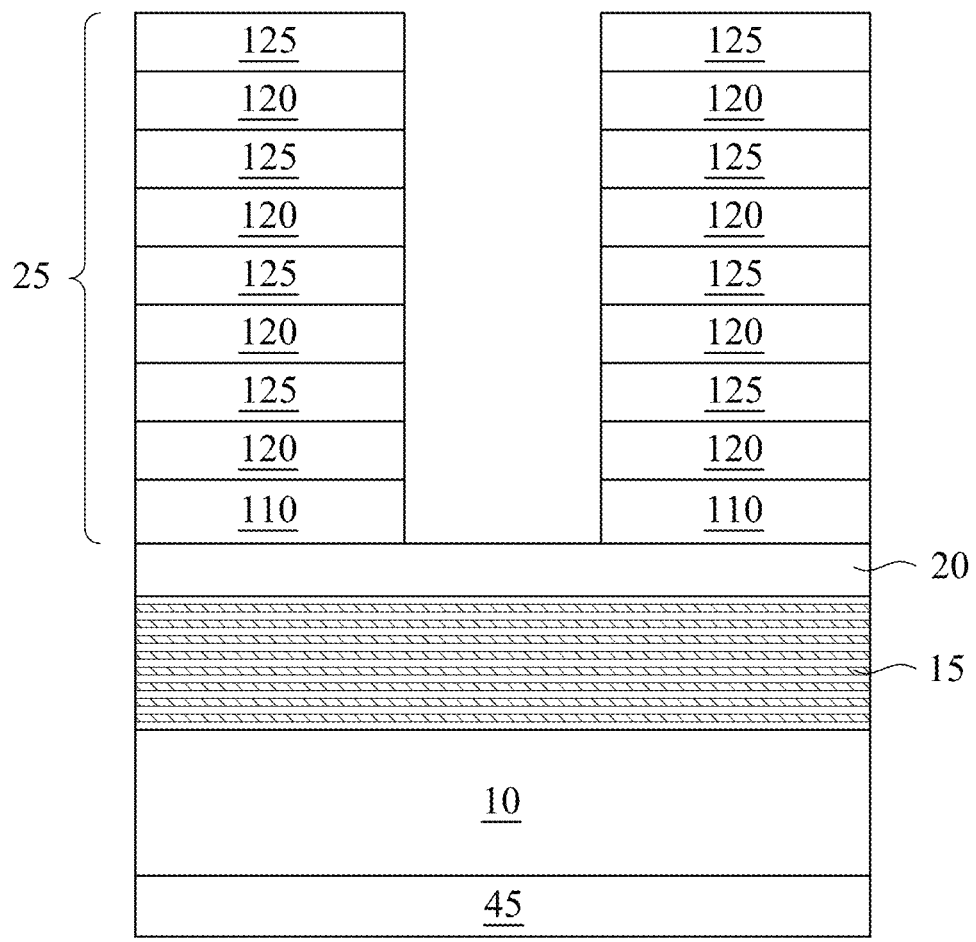
FIGS. 3A, 3B, 3C and 3D show cross sectional views of EUV photo masks according to embodiments of the present disclosure.
Figure 3B:
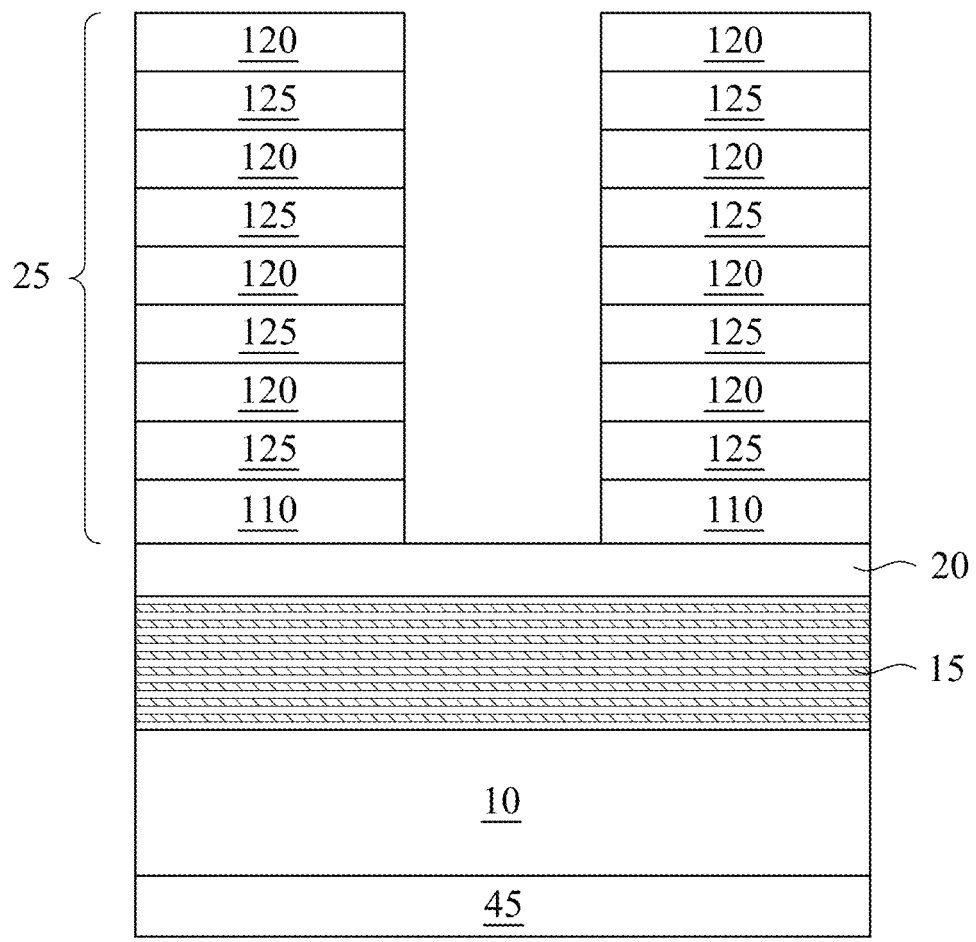

As shown in FIG. 3A, in some embodiments, the second layer 125 is disposed on the first layer 120 in each pair (e.g., four pairs). In other embodiments, as shown in FIG. 3B, the first layer 120 is disposed on the second layer 125 in each pair (e.g., four pairs). In FIGS. 3A and 3B, the number of the first layers 120 is equal to the number of the second layers 125.

Figure 3C:
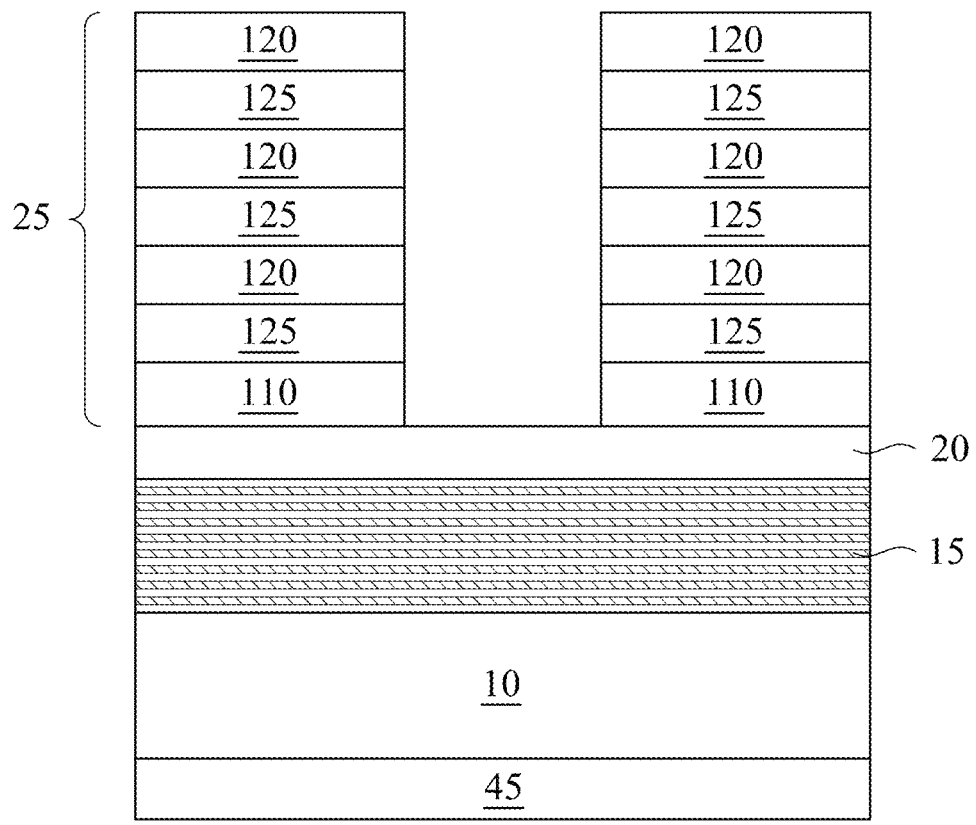
Figure 3D:
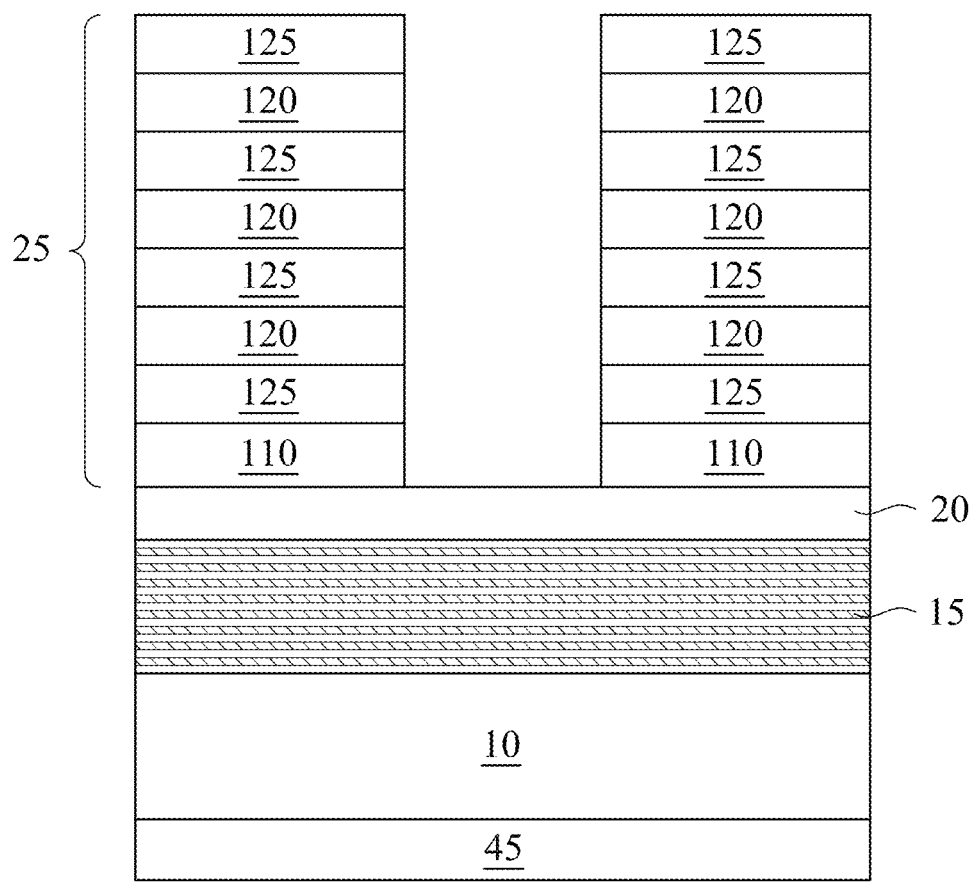

In some embodiments, as shown in FIG. 3C, the second layer 125 is disposed on the first layer 120 in each pair (e.g., three pairs), and an additional first layer 120 is further formed on the three pairs. Thus, the number of pairs is 3.5. In other embodiments, as shown in FIG. 3D, the first layer 120 is disposed on the second layer 125 in each pair (e.g., three pairs), and an additional second layer 125 is further formed on the three pairs. Thus, the number of pairs is 3.5. In FIGS. 3B and 3C, the number of the first layers 120 is different from the number of the second layers 125, and the difference in the number is one.

In some embodiments, the absorber layer 25 includes four CrN layer as the first layers 120 and three CrON layers as second layers 125, alternately stacked as shown in FIG. 3C. In other embodiments, the absorber layer 25 includes three CrN layer as the first layers 120 and four CrON layers as second layers 125, alternately stacked as shown in FIG. 3D.

In some embodiments, a thickness of each of the first layer 120 and the second layer 125 is in a range from 1 nm to 8 nm. In some embodiments, the thickness of each of the first layer 120 and the second layer 125 is less than a half of the wavelength of the EUV light. In some embodiments, the thickness of the first layer 120 and the second layer 125 are equal to each other. In other embodiments, the thickness of the first layer 120 is greater than or smaller than the thickness of the second layer 125. In some embodiments, the thickness of the first layer 120 and/or the second layer 120 is 1 nm±10%, 2 nm±10%, 3 nm±10%, 4 nm±10%, 5 nm±10%, 6 nm±10%, 7 nm±10%, or 8 nm±10%. In other embodiments, the thickness of the first layer 120 and/or the second layer 120 is 1 nm±5%, 2 nm±5%, 3 nm±5%, 4 nm±5%, 5 nm±5%, 6 nm±5%, 7 nm±5%, or 8 nm±5%. In some embodiments, the thickness variation of the first layers 120 in the absorber layer 25 is less than 10% of the average thickness of the first layers 120. In some embodiments, the thickness variation of the second layers 125 in the absorber layer 25 is less than 10% of the average thickness of the second layers 125. In some embodiments, the thickness of the first layer 120 and/or the second layer 125 increases as the distance from the substrate increases. In other embodiments, the thickness of the first layer 120 and/or the second layer 125 decreases as the distance from the substrate increases.

In some embodiments, the absorber layer 25 includes four CrN layer each having a thickness 6 nm±10% as the first layers 120 and three CrON layers each having a thickness of 5 nm±10% as second layers 125, alternately stacked as shown in FIG. 3C. In other embodiments, the absorber layer 25 includes three CrN layer having a thickness 6 nm±10% as the first layers 120 and four CrON layers having a thickness of 5 nm±10% as second layers 125, alternately stacked as shown in FIG. 3D.

In some embodiments, the total thickness of the absorber layer 25 including the bottom absorber layer 110 and the multiple layers of the first layer 120 and the second layer 125 is more than about 30 nm and less than about 50 nm. In certain embodiments, the total thickness of the absorber layer 25 is less than about 45 nm.

FIGS. 4A-4G and 5A-5G schematically illustrate a sequential operation of fabricating an EUV reflective photo mask according to embodiments of the present disclosure. It is understood that additional operations can be provided before, during, and after processes shown by FIGS. 4A-5G, and some of the operations described below can be replaced or eliminated, for additional embodiments of the method. The order of the operations/processes may be interchangeable. Materials, configurations, processes and/or dimensions as explained with respect to the foregoing embodiments may be employed in the following embodiments and detailed description thereof may be omitted.

Figure 4A:
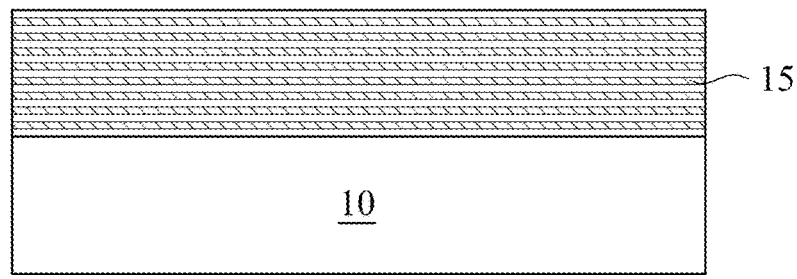
FIGS. 4A, 4B, 4C, 4D, 4E, 4F and 4G show a sequential manufacturing operation of an EUV photo mask according to an embodiment of the present disclosure.

FIGS. 4A-4G schematically illustrate a sequential operation of fabricating a EUV reflective photo mask blank according to embodiments of the present disclosure. In the fabrication of an EUV photo mask, a multilayer stack 15 is formed over the substrate 10 as shown in FIG. 4A. In some embodiments, the multilayer stack 15 includes multiple alternating layers of silicon and molybdenum. In some embodiments, the thickness of each silicon layer is about 4 nm and the thickness of each molybdenum layer is about is about 3 nm. In some embodiments, the silicon and molybdenum layers are formed by CVD, plasma-enhanced CVD, ALD, ion bean deposition, sputtering, or any other suitable film forming method.

Figure 4B:
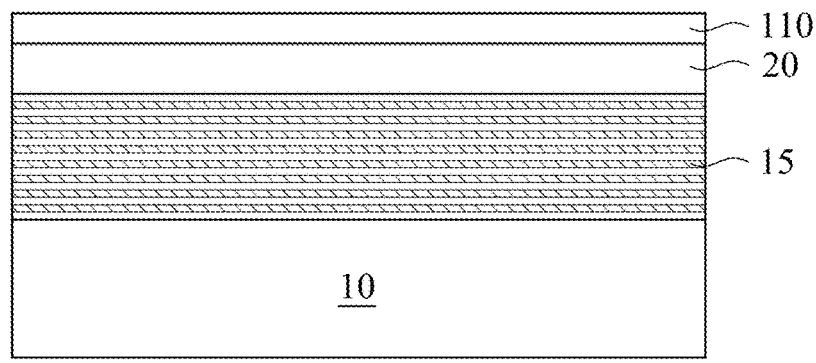

Then, as shown in FIG. 4B, a capping layer 20 and a bottom absorber layer 110 are formed over the multilayer stack 15. In some embodiments, the capping layer includes Ru or a Ru alloy and is formed by CVD, plasma-enhanced CVD, ALD, ion bean deposition, sputtering, or any other suitable film forming method.

The bottom absorber layer 110 is a Ta based layer including TaB, TaO, TaBO and/or TaBN formed by CVD, plasma-enhanced CVD, ALD, ion bean deposition, sputtering, or any other suitable film forming method. In certain embodiments, the bottom absorber layer 110 is TaBO having a thickness of 2 nm±10%. In some embodiments, the bottom absorber layer 110 functions as an etch stop layer.

Figure 4C:
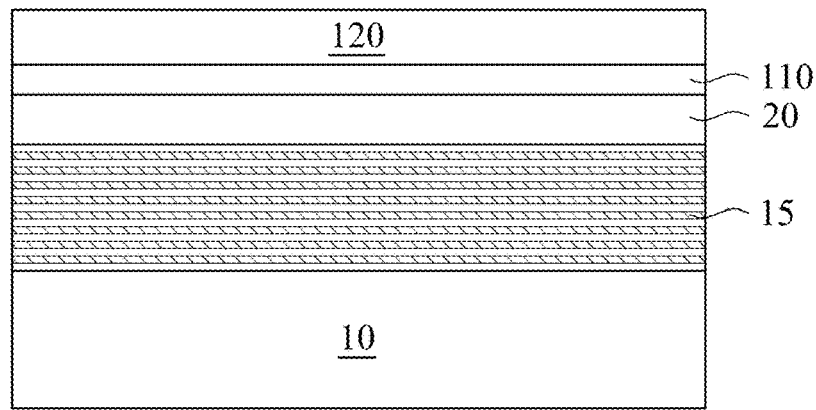
Figure 4D:
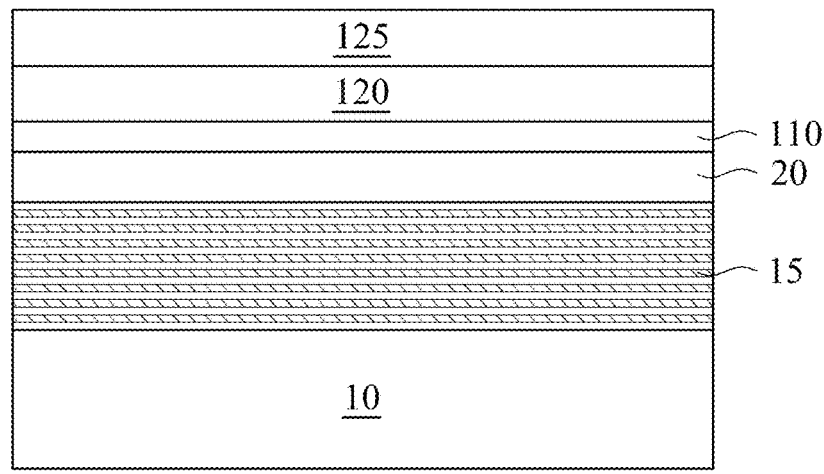
Figure 4E:
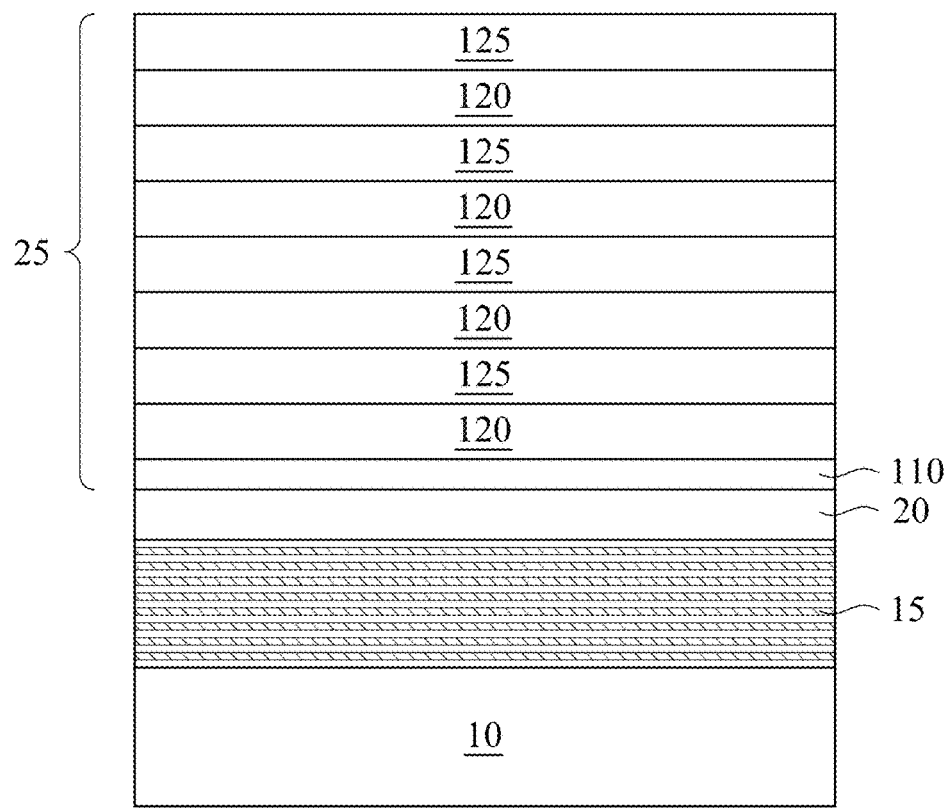

Further, as shown in FIGS. 4C to 4E, first layers 120 and second layers 125 are alternately formed on the bottom absorber layer 110. In some embodiments, the first layer 120 is formed on the bottom absorber layer 110, and then the second layer 125 is formed on the first layer. In other embodiments, the second layer 125 is formed on the bottom absorber layer 110, and then the first layer 120 is formed on the second layer 125. As shown in FIG. 4E, the formation of the first layer 120 and the second layer 125 are repeated to obtain the absorber layer 25.

When the first layer 120 is made of CrN and the second layer 125 is made of CrON, the CrN layer is formed by sputtering using a Cr target and a nitrogen containing gas, such as $N_2$, and the CrON layer is formed by sputtering using a Cr target and a gas containing nitrogen and oxygen, such as a mixture of $O_2$ and $N_2$. By changing a ratio of flow rates of $O_2$ and $N_2$, it is possible to control a ratio of O and N in the CrON layer. The sputtering gas may further contain Ar, He and/or Ne. In some embodiments, by controlling the flow of $O_2$ (on/off), the multilayer of CrN and CrON is formed.

Figure 4F:
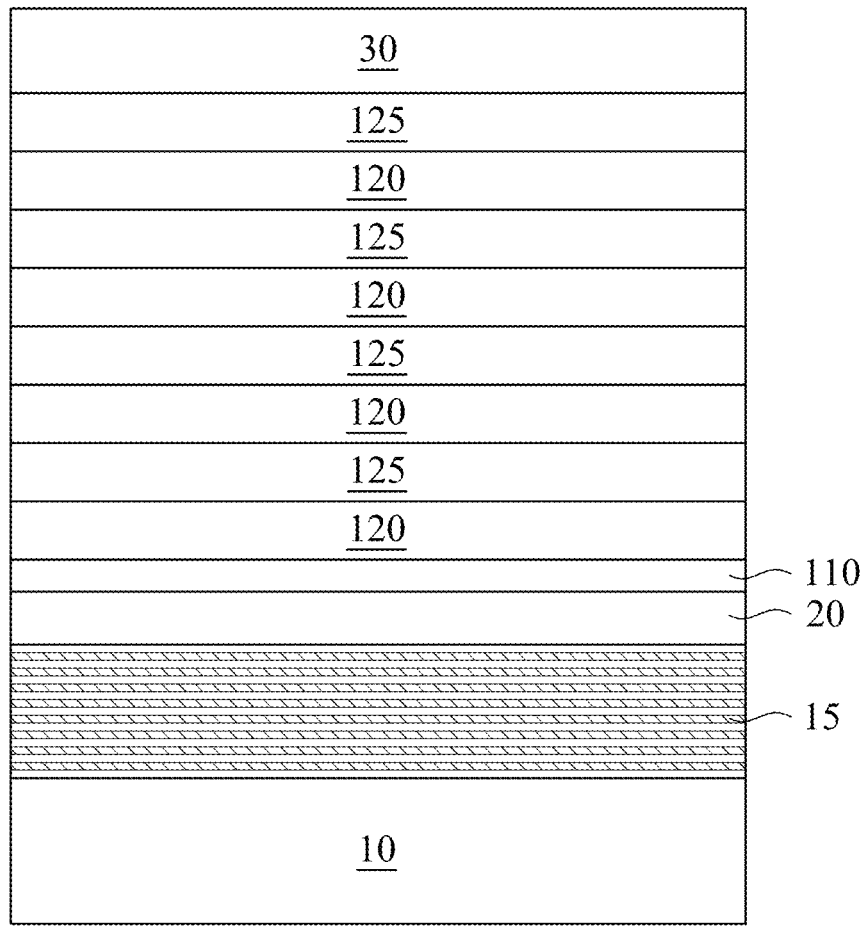

Then, as shown in FIG. 4F, a hard mask layer 30 is formed on the absorber layer 25. The hard mask layer 30 is a Ta based layer including TaB, TaO, TaBO and/or TaBN formed by CVD, plasma-enhanced CVD, ALD, ion bean deposition, sputtering, or any other suitable film forming method. In some embodiments, the material of the hard mask layer 30 is the same as or similar to the bottom absorber layer. In some embodiments, the thickness of the hard mask layer 30 is in a range from about 2 nm to about 10 nm. In certain embodiments, the hard mask layer 30 is TaBO having a thickness of 6 nm±10%.

Figure 4G:
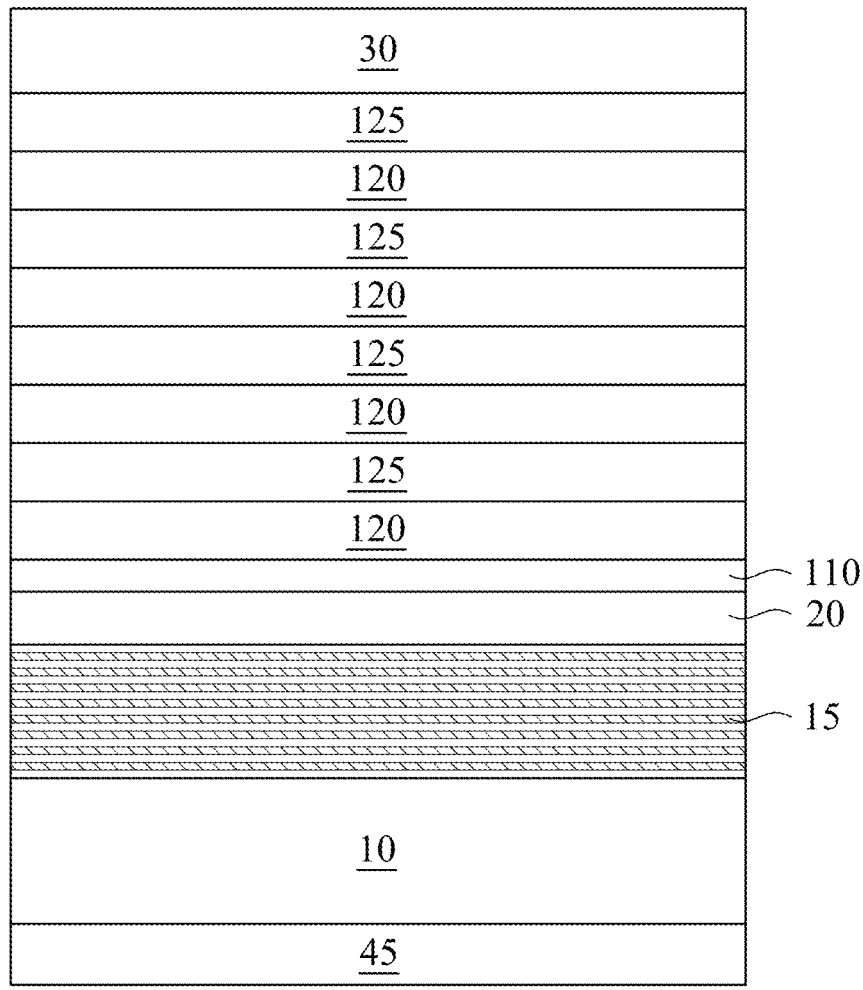

Further, as shown in FIG. 4G, a backside conductive layer 45 is formed on the back side of the substrate 10 by CVD, plasma-enhanced CVD, ALD, ion bean deposition, sputtering, or any other suitable film forming method, thereby a mask blank is obtained.

FIGS. 5A-5G schematically illustrate a sequential operation of an EUV reflective photo mask with circuit patterns according to embodiments of the present disclosure.

Figure 5A:
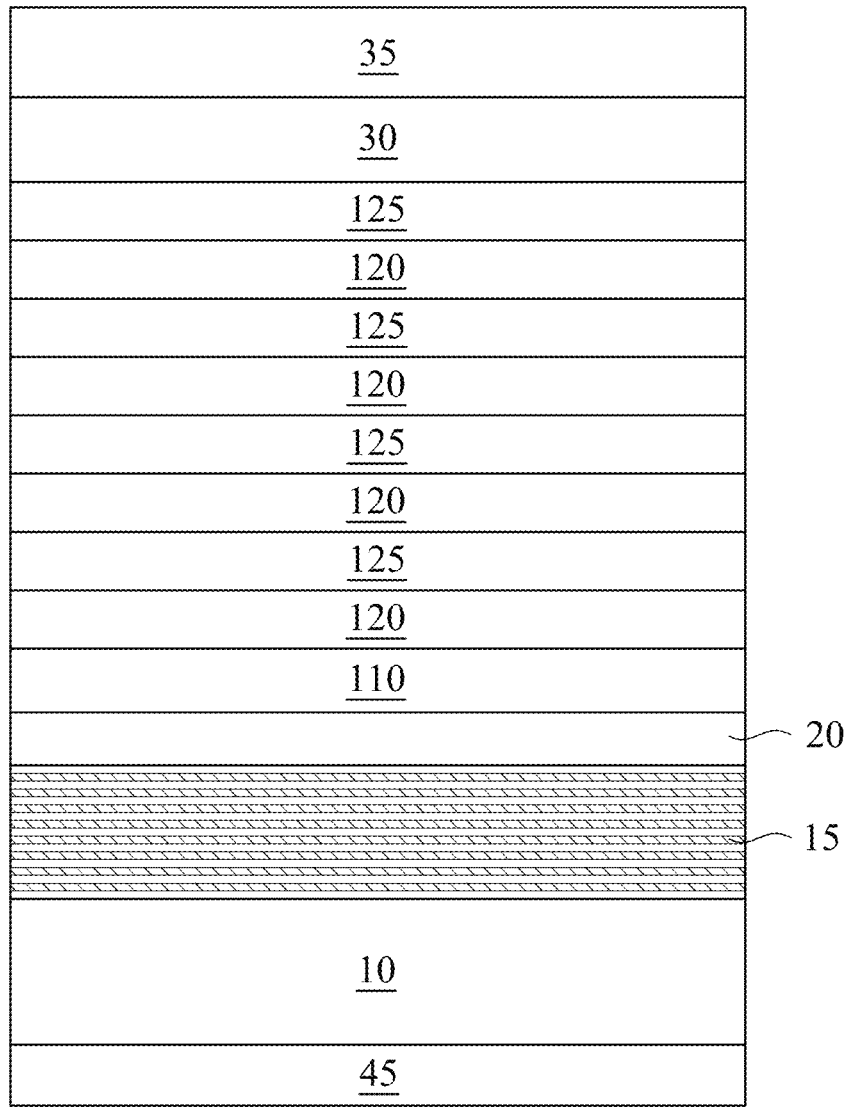
FIGS. 5A, 5B, 5C, 5D, 5E, 5F and 5G show a sequential manufacturing operation of an EUV photo mask according to an embodiment of the present disclosure.
Figure 5B:
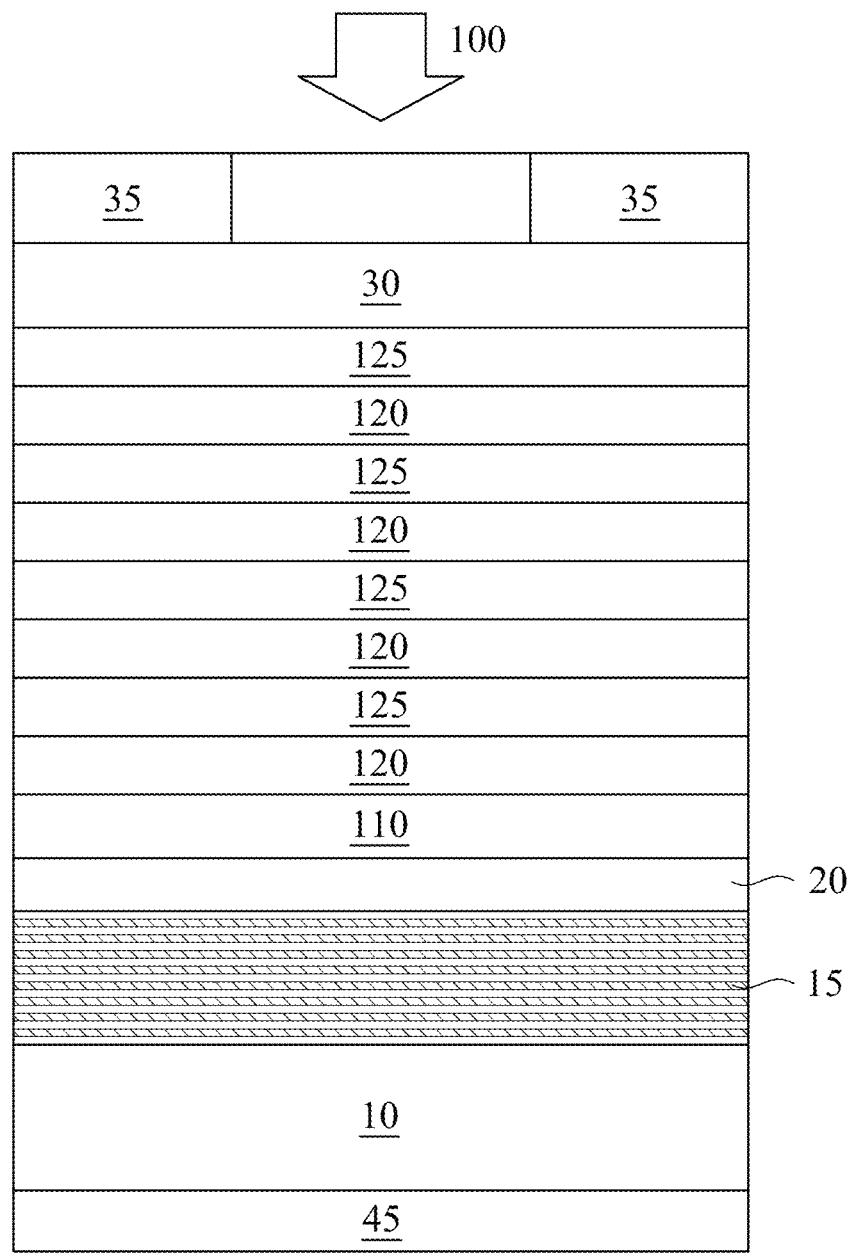
Figure 5C:
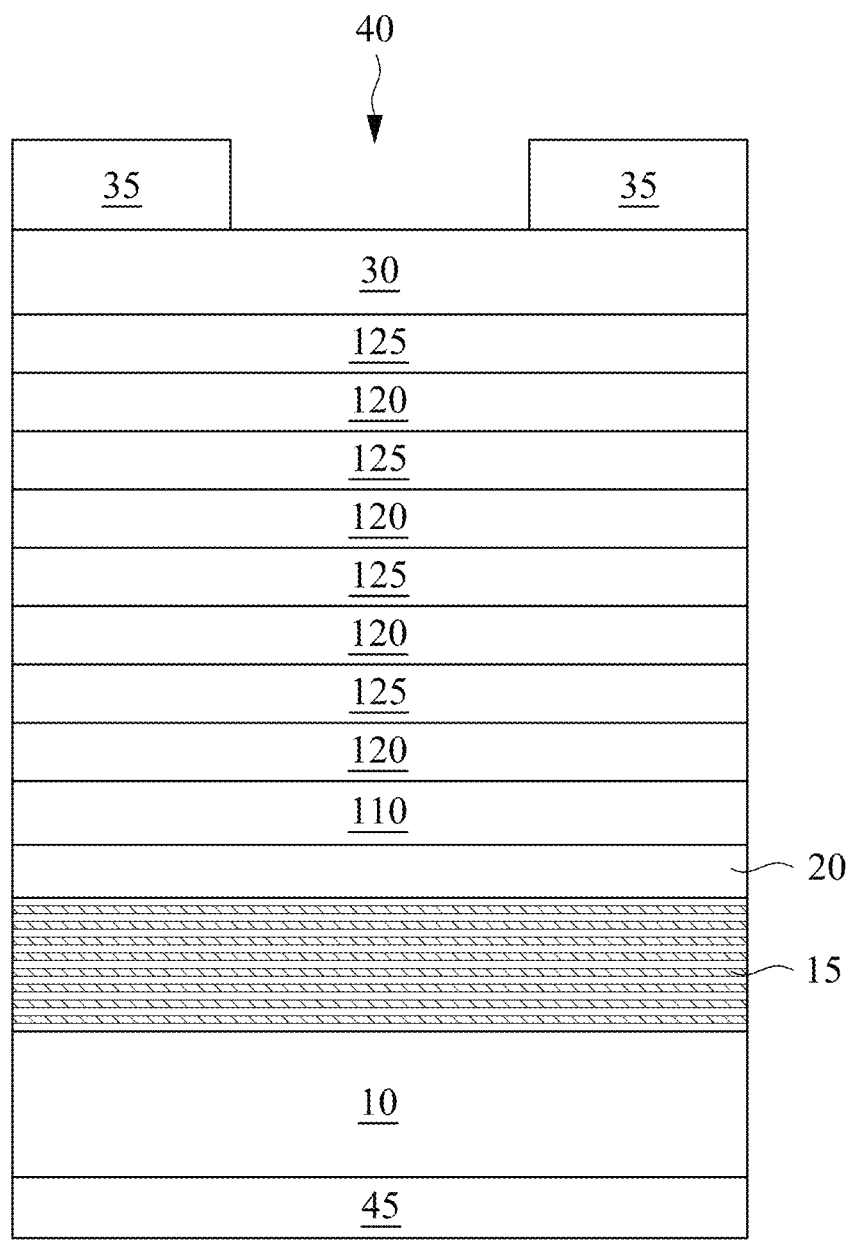

As shown in FIG. 5A, a photoresist layer 35 is formed over the hard mask layer 30 of the EUV photo mask blank. Then, as shown in FIG. 5B, the photoresist layer 35 is selectively exposed to actinic radiation 100, such as an electron beam or an ion beam. The selectively exposed photoresist layer 35 is developed to form a circuit pattern 40 in the photoresist layer 35 as shown in FIG. 5C.

Figure 5D:
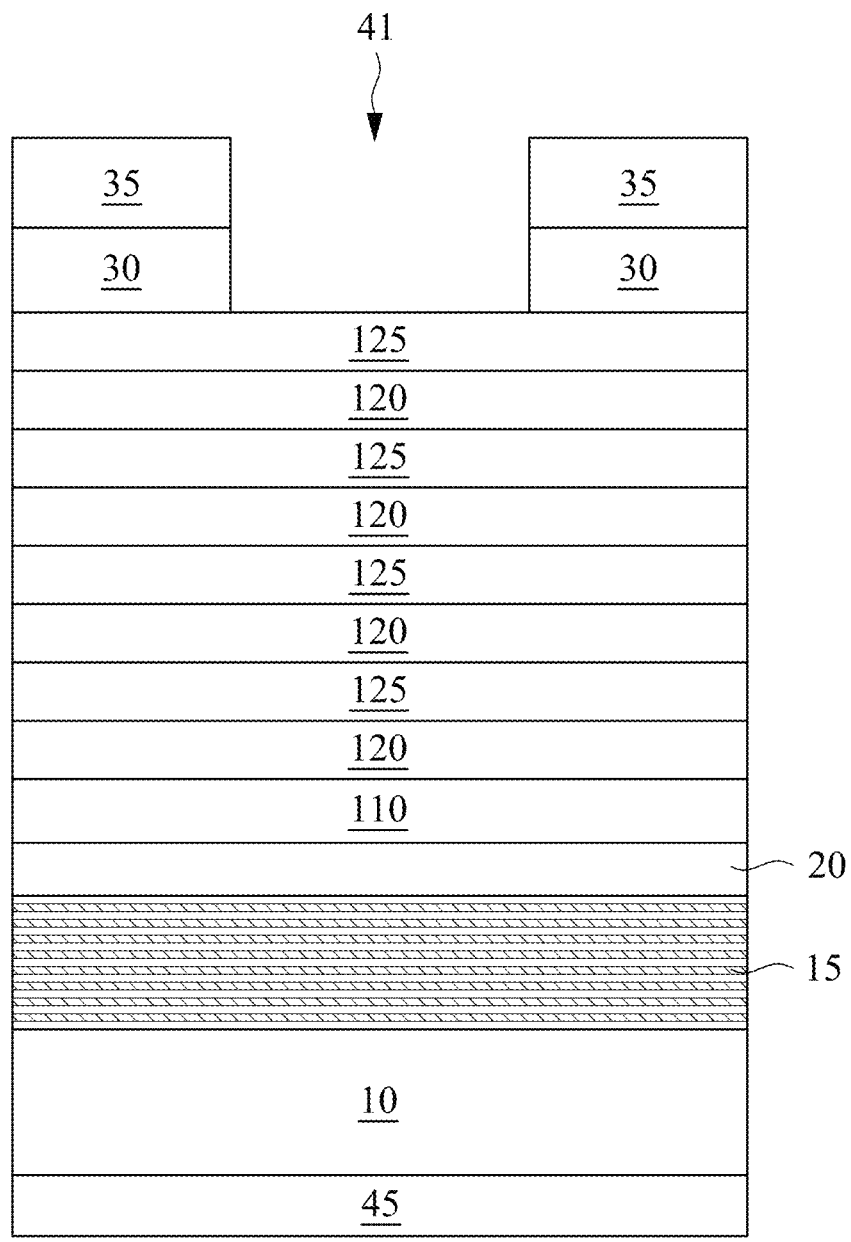
Figure 5E:
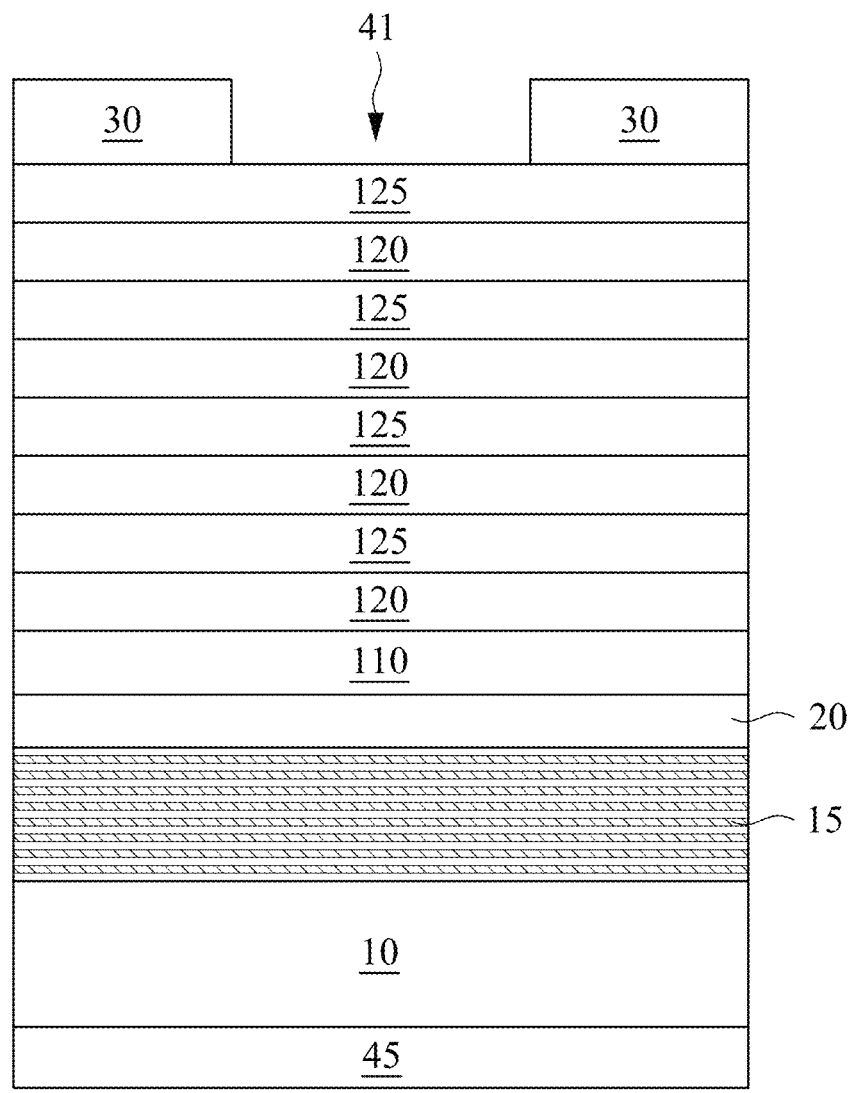

Next, the pattern 40 in the photoresist layer 35 is extended into the hard mask layer 30 forming a pattern 41 in the hard mask layer 30 exposing portions of the top layer (e.g., second layer 125 or the first layer 120) of the absorber layer 25, as shown in FIG. 5D. The pattern 41 extended into the hard mask layer 30 is formed by etching, in some embodiments, using a suitable wet or dry etchant that is selective to the hard mask layer 30. After the pattern 41 by the hard mask layer 30 is formed, the photoresist layer 35 is removed by photoresist stripper to expose the upper surface of the hard mask layer 30, as shown in FIG. 5E.

Figure 5F:
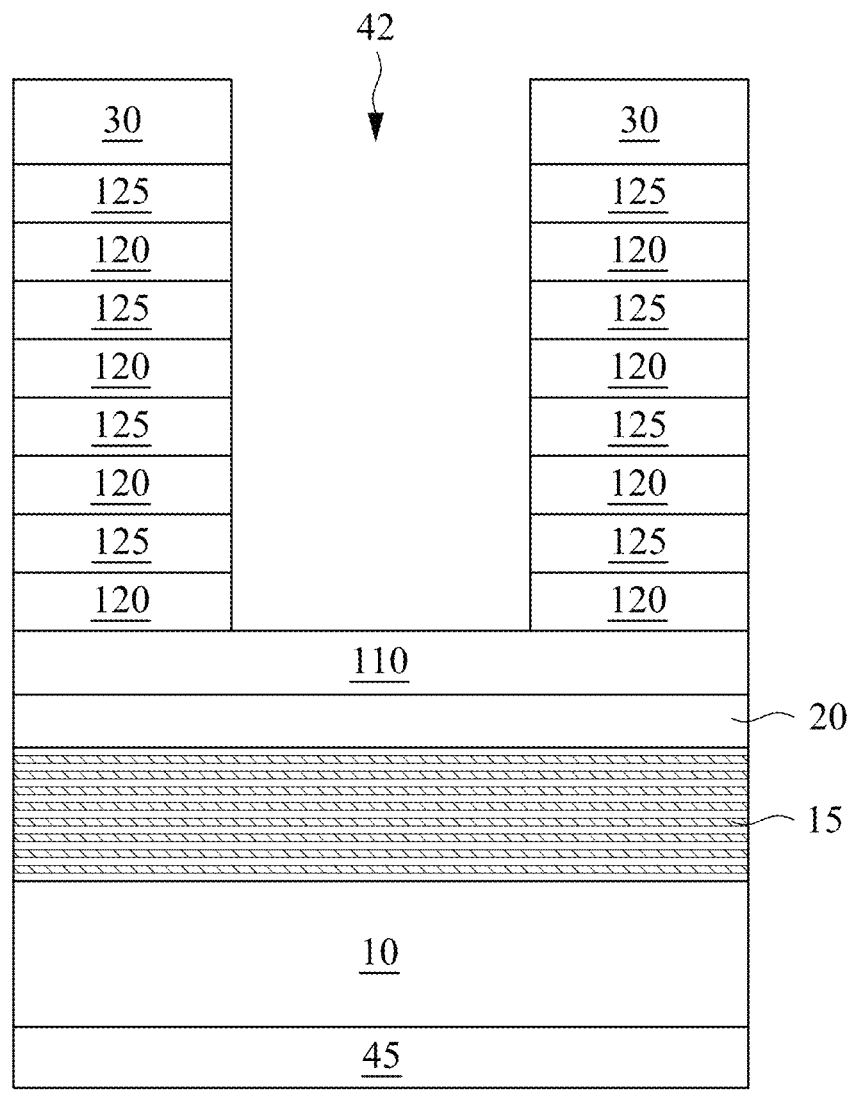

Then, the pattern 41 in the hard mask layer 30 is extended into the absorber layer 25 forming a pattern 42 in the absorber layer 25 as shown in FIG. 5F. Since the bottom absorber layer 110 is made of the same material as or a similar material as the hard mask layer 30, the etching substantially stops at the surface of the bottom absorber layer 110, as shown in FIG. 5F.

When the first and second layers 120, 125 of the absorber layer 25 are made of a Cr based material (CrN, CrON), a plasma dry etching using a Cl containing gas is used in some embodiments. In some embodiments, the Cl containing gas is a mixture of $Cl_2$ and/or $CCl_4$, and $O_2$. In certain embodiments, a mixture of $Cl_2$ and $O_2$ is used.

When the first layer 120 is CrN and the second layer 125 is CrON, the plasma uses a mixture of $Cl_2$ and $O_2$, an etching rate of the CrON by the plasma using the mixture of $Cl_2$ and $O_2$ is higher than an etching rate of the CrN layer. Accordingly, the etching is easier to be controlled than the case where the absorber layer 25 includes a bulk CrN layer. For example, a profile of the vertical sides of the pattern 42 is substantially vertical to the substrate 10. In other embodiments, a gas containing fluorine, such as $CF_2H$ and/or $CF_4$, can be used together with an $O_2$ gas.

Figure 5G:
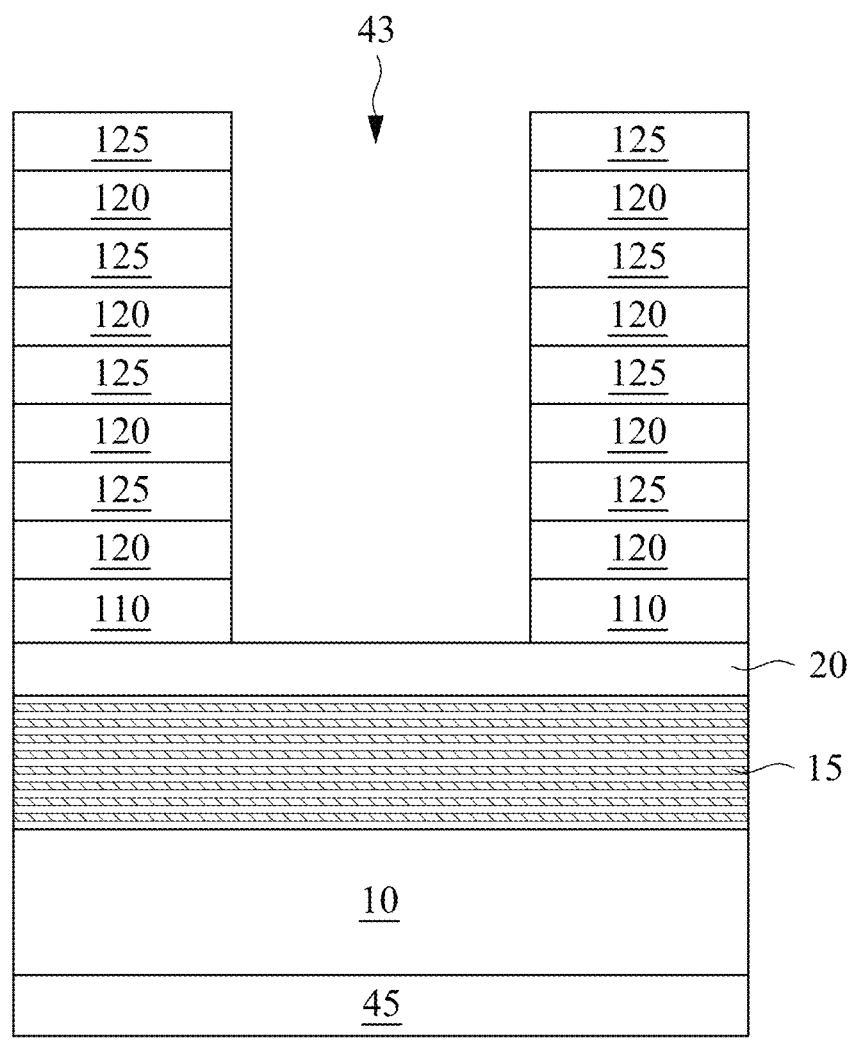

Then, as shown in FIG. 5G, the hard mask layer 30 and the exposed portion of the bottom absorber layer 110 are removed by using a suitable etching operation. The "similar" materials for the hard mask layer 30 and the bottom absorber layer 110 mean that the hard mask layer 30 and the exposed portion of the bottom absorber layer 110 are removed together and the bottom absorber layer 110 functions as an etch stop layer.

After the circuit pattern 43 is formed as shown in FIG. 5G, a black border is formed by operations as explained with FIGS. 2E-2G, and a cleaning operation and an inspection operation are performed to provide a finished photo mask.

Figure 6A:
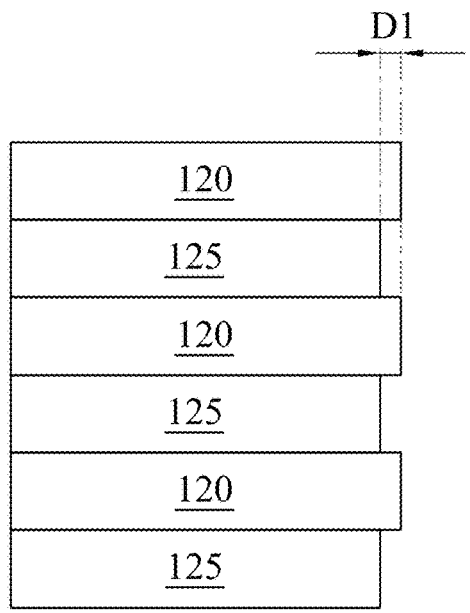
FIGS. 6A, 6B and 6C show cross sectional views of an multilayer structure of an absorber layer according to another embodiment of the present disclosure.
Figure 6B:
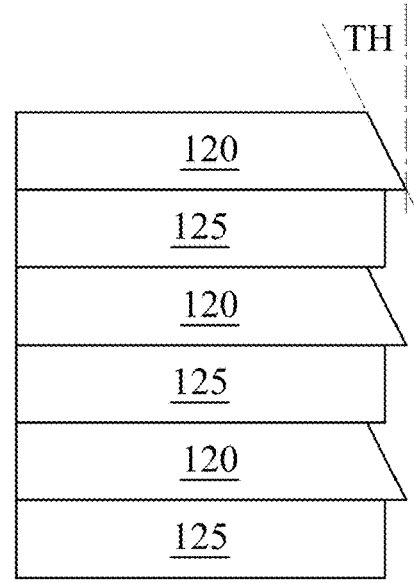
Figure 6C:
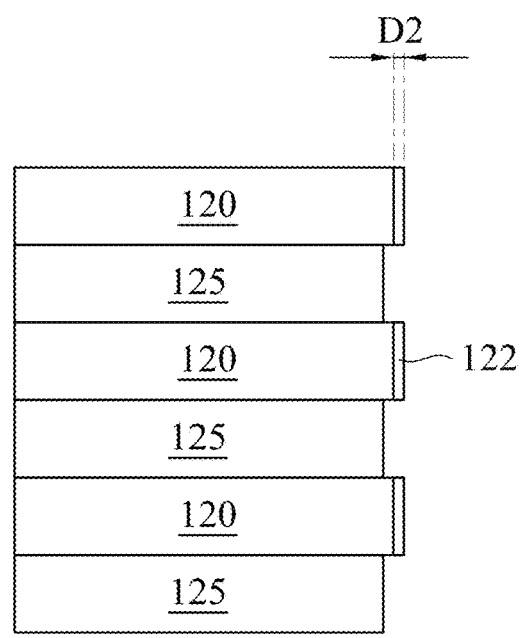

FIGS. 6A, 6B and 6C show cross sectional views of a multilayer structure of an absorber layer according to another embodiment of the present disclosure.

As set forth above, when the first layer 120 and the second layer 125 are made of different materials, an etching rate of the first layer is different from an etching rate of the second layer. When the etching rate of the first layer is smaller than the etching rate of the second layer, the side profile of the etched absorber layer 25 has an uneven surface as shown in FIG. 6A in some embodiments. In some embodiments, a distance D1 between a lateral end of the first layer 120 and a lateral end of the second layer 125 is in a range from about 0.5 nm to about 2 nm. Since the thickness of each of the first layer 120 and second layer 125 are sufficiently smaller than the wavelength of the EUV light, such an unevenness may not affect patterning in an EUV lithography.

In some embodiments, when the etching rate of the first layer 120 is small, the side profile of the first layers 120 has a tapered shape as shown in FIG. 6B. The taper angle TH is in a range from about 5 degrees to about 15 degrees in some embodiments. In other embodiments, the side profile of the second layers 125 also has a tapered shape having the taper angle in a range from about 1 degrees to about 10 degrees, which is smaller than the taper angle TH of the first layers 120 in some embodiments Further, in some embodiments, when the first layer 120 is CrN, the etched side surface of the first layer 120 is slightly oxidized to form an oxidized portion 122 (CrON portion), as shown in FIG. 6C. In some embodiments, the thickness D2 of the oxidized portion 122 is in a range from about 0.1 nm to about 2 nm.

Figure 7:
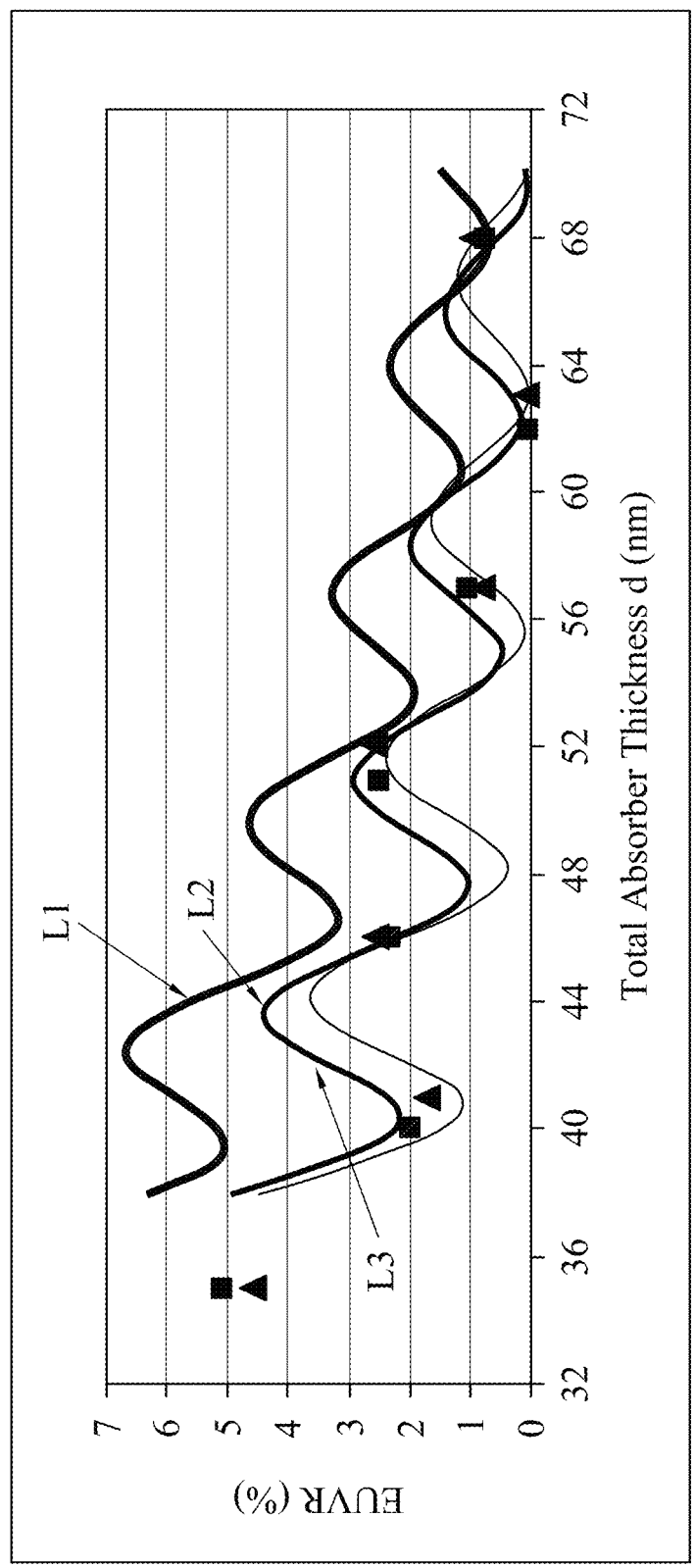
FIG. 7 shows simulation results of reflectivity of various absorber structures.

FIG. 7 shows simulation results of the reflectivity of various absorber structures.

Line L1 shows a reflectivity of an absorber layer having a TaBN layer formed on a 2 nm TaBO layer, line L2 shows a reflectivity of an absorber layer having a CrN layer formed on a 2 nm TaBO layer, and line L3 shows a reflectivity of an absorber layer having a CrON layer formed on a 2 nm TaBO layer. The triangular shapes show a reflectivity of an absorber layer having CrN and CrON alternate layers formed on a 2 nm TaBO layer, where a CrN layer is in contact with the TaBO layer. The square shapes show a reflectivity of an absorber layer having CrN and CrON alternate layers formed on a 2 nm TaBO layer, where a CrON layer is in contact with the TaBO layer. The thickness of each of the CrN layers is set to 6 nm and the thickness of each of the CrON layers is set to 5 nm.

As shown in FIG. 7, when the absorber layer has four CrN layers and three CrON layers on the TaBO layer (3.5 pairs, the total thickness is 41 nm), the reflectivity is about 1.7%. When the absorber layer has three CrN layers and four CrON layers on the TaBO layer (3.5 pairs, the total thickness is 40 nm), the reflectivity is about 2.0%. To obtain a reflectivity less than 2%, in the case of line L1, a thickness around 70 nm is necessary. The multilayer structure of CrN and CrON can achieve a low reflectivity less than about 2.0% with a total absorber thickness less than about 45 nm.

Figure 8A:
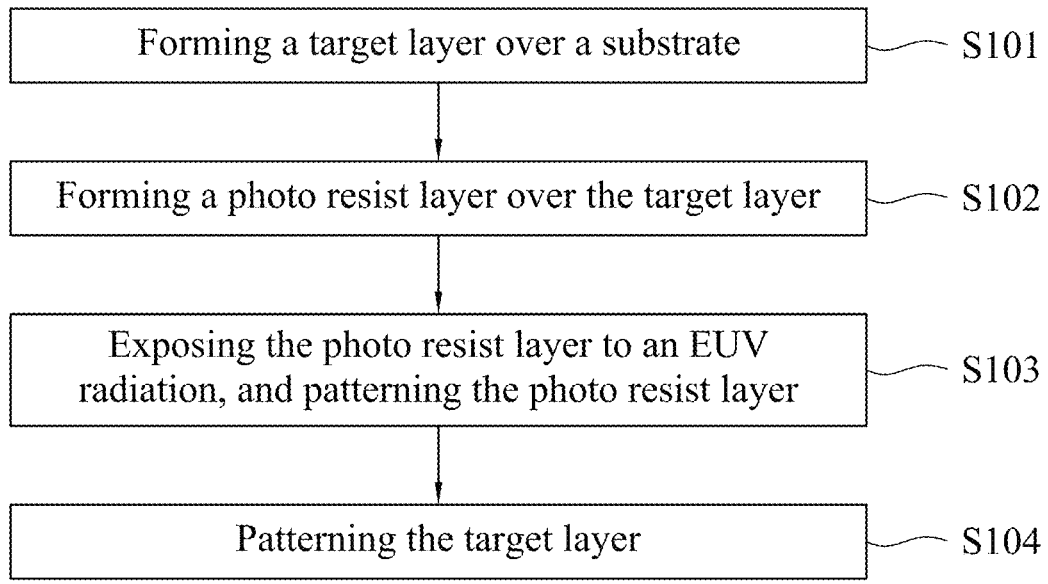
FIG. 8A shows a flowchart of a method making a semiconductor device.
Figure 8B:
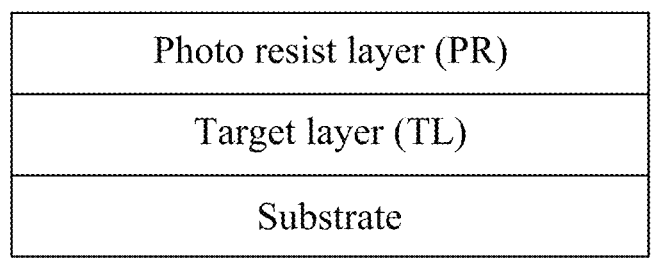
FIGS. 8B, 8C, 8D and 8E show a sequential manufacturing operation of a method of making a semiconductor device in accordance with embodiments of present disclosure.
Figure 8C:
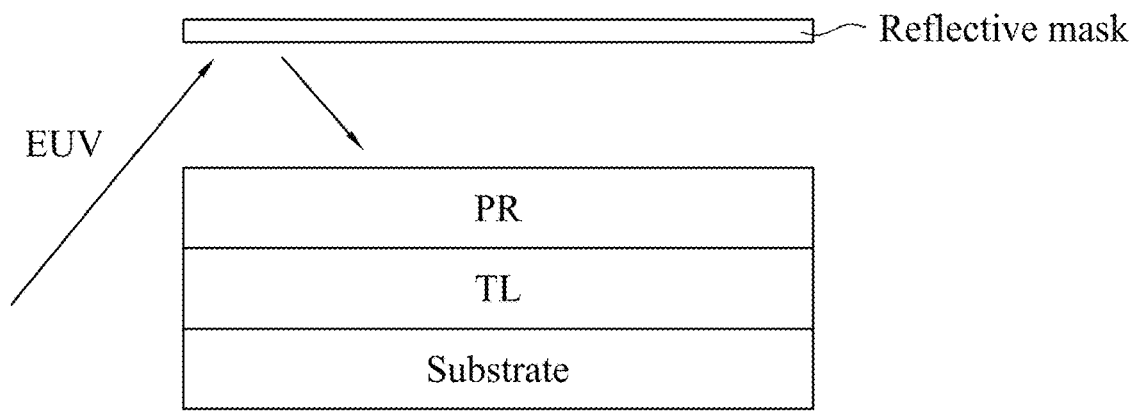

FIG. 8A shows a flowchart of a method making a semiconductor device, and FIGS. 8B, 8C, 8D and 8E show a sequential manufacturing operation of the method of making a semiconductor device in accordance with embodiments of present disclosure. A semiconductor substrate or other suitable substrate to be patterned to form an integrated circuit thereon is provided. In some embodiments, the semiconductor substrate includes silicon. Alternatively or additionally, the semiconductor substrate includes germanium, silicon germanium or other suitable semiconductor material, such as a Group III-V semiconductor material. At S101 of FIG. 8A, a target layer to be patterned is formed over the semiconductor substrate. In certain embodiments, the target layer is the semiconductor substrate. In some embodiments, the target layer includes a conductive layer, such as a metallic layer or a polysilicon layer, a dielectric layer, such as silicon oxide, silicon nitride, SION, SiOC, SiOCN, SiCN, hafnium oxide, or aluminum oxide, or a semiconductor layer, such as an epitaxially formed semiconductor layer. In some embodiments, the target layer is formed over an underlying structure, such as isolation structures, transistors or wirings. At S102, of FIG. 8A, a photo resist layer is formed over the target layer, as shown in FIG. 8B. The photo resist layer is sensitive to the radiation from the exposing source during a subsequent photolithography exposing process. In the present embodiment, the photo resist layer is sensitive to EUV light used in the photolithography exposing process. The photo resist layer may be formed over the target layer by spin-on coating or other suitable technique. The coated photo resist layer may be further baked to drive out solvent in the photo resist layer. At S103 of FIG. 8A, the photoresist layer is patterned using an EUV reflective mask as set forth above, as shown in FIG. 8B. The patterning of the photoresist layer includes performing a photolithography exposing process by an EUV exposing system using the EUV mask. During the exposing process, the integrated circuit (IC) design pattern defined on the EUV mask is imaged to the photoresist layer to form a latent pattern thereon. The patterning of the photoresist layer further includes developing the exposed photoresist layer to form a patterned photoresist layer having one or more openings. In one embodiment where the photoresist layer is a positive tone photoresist layer, the exposed portions of the photoresist layer are removed during the developing process. The patterning of the photoresist layer may further include other process steps, such as various baking steps at different stages. For example, a post-exposure-baking (PEB) process may be implemented after the photolithography exposing process and before the developing process.

Figure 8D:
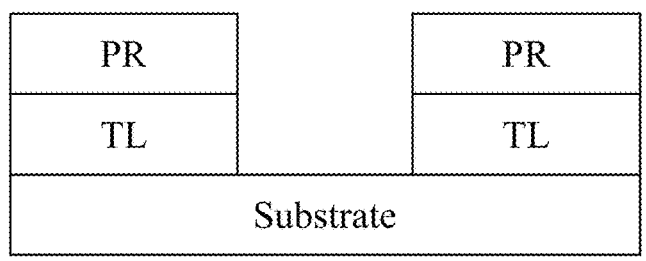
Figure 8E:
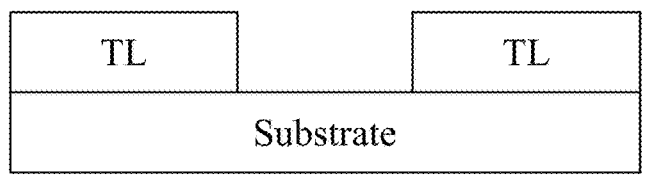

At S104 of FIG. 8A, the target layer is patterned utilizing the patterned photoresist layer as an etching mask, as shown in FIG. 8D. In some embodiments, the patterning the target layer includes applying an etching process to the target layer using the patterned photoresist layer as an etch mask. The portions of the target layer exposed within the openings of the patterned photoresist layer are etched while the remaining portions are protected from etching. Further, the patterned photoresist layer may be removed by wet stripping or plasma ashing, as shown in FIG. 8E.

In the present disclosure, by using a multilayer structure for an absorber layer, even if the absorber layer includes a low etch rate material (e.g., CrN), it is possible to improve an etching rate and to obtain a substantially vertical side profile at the patterned absorber layer. Further, it is possible to obtain a thinner absorber layer with a sufficiently low reflectance (a high absorption).

It will be understood that not all advantages have been necessarily discussed herein, no particular advantage is required for all embodiments or examples, and other embodiments or examples may offer different advantages.

According to one aspect of the present application, a reflective mask includes a substrate, a reflective multilayer disposed on the substrate, a capping layer disposed on the reflective multilayer, and an absorber layer disposed on the capping layer. The absorber layer includes one or more alternating pairs of a first Cr based layer and a second Cr based layer different from the first Cr based layer. In one or more of the foregoing and following embodiments, the first Cr based layer is CrN or CrNiN, and the second Cr based layer is CrON. In one or more of the foregoing and following embodiments, a number of the pairs of the first Cr based layer and the second Cr based layer is three to six. In one or more of the foregoing and following embodiments, the absorber layer includes three pairs of the first Cr based layer and the second Cr based layer. In one or more of the foregoing and following embodiments, in each pair of the three pairs, the second Cr based layer is disposed on the first Cr based layer. In one or more of the foregoing and following embodiments, the absorber layer further includes a top Cr based layer disposed on the three pairs, and the top Cr based layer is made of a same material as the first Cr based layer. In one or more of the foregoing and following embodiments, in each pair of the three pairs, the first Cr based layer is disposed on the second Cr based layer. In one or more of the foregoing and following embodiments, the absorber layer further includes a top Cr based layer disposed on the three pairs, and the top Cr based layer is made of a same material as the second Cr based layer. In one or more of the foregoing and following embodiments, the absorber layer further includes a Ta based layer between the capping layer and the one or more alternating pairs of the first Cr based layer and the second Cr based layer is three to six pairs.

In accordance with another aspect of the present disclosure, a reflective mask includes a substrate, a reflective multilayer disposed on the substrate, a capping layer disposed on the reflective multilayer, and an absorber layer disposed on the capping layer. The absorber layer includes CrN layers and CrON layers alternately stacked, and a thickness of each of the CrN layers is in a range from 1 nm to 8 nm and a thickness of each of the CrON layers is in a range from 1 nm to 8 nm. In one or more of the foregoing and following embodiments, a total thickness of the absorber layer is less than 45 nm. In one or more of the foregoing and following embodiments, the thickness of each of the CrN layers is greater than the thickness of each of the CrON layers. In one or more of the foregoing and following embodiments, the thickness of each of the CrN layers is 6 nm±10% and the thickness of each of the CrON layers is 5 nm±10%. In one or more of the foregoing and following embodiments, a number of the CrN layers is four and a number of the CrON layers is three, and one of the CrN layer is in contact with the capping layer. In one or more of the foregoing and following embodiments, a number of the CrN layers is equal to a number of the CrON layers. In one or more of the foregoing and following embodiments, a difference between a number of the CrN layers and a number of the CrON layers is one.

In accordance with another aspect of the present disclosure, a reflective mask includes a substrate, a reflective multilayer disposed on the substrate, a capping layer disposed on the reflective multilayer, and an absorber layer disposed on the capping layer. The absorber layer includes two or more pairs of a first layer and a second layer different from the first layer. In one or more of the foregoing and following embodiments, the first layer is CrN or CrNiN, and the second layer is CrON. In one or more of the foregoing and following embodiments, the first layer is TaCo, and the second layer is TaCoO. In one or more of the foregoing and following embodiments, the first layer is Hf, and the second layer is hafnium oxide.

In accordance with one aspect of the present disclosure, in a method of manufacturing a semiconductor device, a target layer is formed over a substrate, a photo resist layer is formed over the target layer, the photo resist layer is patterned by an EUV lithography operation using a reflective photo mask, and the target layer is patterned by using the patterned photo resist layer as an etching mask. The reflective photo mask is the reflective mask of any of the reflective masks as set forth above.

In accordance with one aspect of the present disclosure, in a method of manufacturing a reflective mask, a photo resist layer is formed over a mask blank. The mask blank includes a substrate, a reflective multilayer on the substrate, a capping layer on the reflective multilayer, an absorber layer on the capping layer and a hard mask layer. The photo resist layer is patterned. The hard mask layer is patterned by using the patterned photo resist layer. The absorber layer is patterned by using the patterned hard mask layer. The absorber layer includes two or more pairs of a first Cr based layer and a second Cr based layer different from the first Cr based layer. In one or more of the foregoing and following embodiments, the absorber layer further includes a Ta based layer between the capping layer and the two or more pairs of the first Cr based layer and the second Cr based layer, and the hard mask layer is made of a Ta based material. In one or more of the foregoing and following embodiments, after the hard mask layer is patterned, the patterned photo resist layer is removed. In the patterning the absorber layer, the two or more pairs of the first Cr based layer and the second Cr based layer are patterned to form a space, and the hard mask layer and a part of the Ta based layer are removed in the space. In one or more of the foregoing and following embodiments, the first Cr based layer is CrN, and the second Cr based layer is CrON. In one or more of the foregoing and following embodiments, a number of the pairs of the first Cr based layer and the second Cr based layer is three to six. In one or more of the foregoing and following embodiments, the absorber layer includes three pairs of the first Cr based layer and the second Cr based layer. In one or more of the foregoing and following embodiments, the absorber layer is patterned by plasma etching using a gas containing chlorine. In one or more of the foregoing and following embodiments, the gas containing chlorine is a mixture of $Cl_2$ and $O_2$. In one or more of the foregoing and following embodiments, the gas containing chlorine is a mixture of $CCl_4$ and $O_2$.

In accordance with another aspect of the present disclosure, in a method of manufacturing a reflective mask, a photo resist layer is formed over a mask blank. The mask blank includes a substrate, a reflective multilayer on the substrate, a capping layer on the reflective multilayer, an absorber layer on the capping layer and a hard mask layer. The photo resist layer is patterned. The hard mask layer is patterned by using the patterned photo resist layer. The absorber layer is patterned by using the patterned hard mask layer. The absorber layer includes CrN layers and CrON layers alternately stacked. In one or more of the foregoing and following embodiments, a thickness of each of the CrN layers is in a range from 1 nm to 8 nm and a thickness of each of the CrON layers is in a range from 1 nm to 8 nm. In one or more of the foregoing and following embodiments, a total thickness of the absorber layer is less than 45 nm. In one or more of the foregoing and following embodiments, the thickness of each of the CrN layers is greater than the thickness of each of the CrON layers. In one or more of the foregoing and following embodiments, the thickness of each of the CrN layers is 6 nm±5% and the thickness of each of the CrON layers is 5 nm±5%. In one or more of the foregoing and following embodiments, a number of the CrN layers is four and a number of the CrON layers is three, and one of the CrN layer is in contact with the capping layer. In one or more of the foregoing and following embodiments, a number of the CrN layers is equal to a number of the CrON layers. In one or more of the foregoing and following embodiments, a difference between a number of the CrN layers and a number of the CrON layers is one.

In accordance with another aspect of the present disclosure, in a method of manufacturing a reflective mask, a photo resist layer is formed over a mask blank. The mask blank includes a substrate, a reflective multilayer on the substrate, a capping layer on the reflective multilayer, an absorber layer on the capping layer and a hard mask layer. The photo resist layer is patterned. The hard mask layer is patterned by using the patterned photo resist layer. The absorber layer is patterned by using the patterned hard mask layer. The absorber layer includes two or more pairs of a first layer and a second layer different from the first layer. In one or more of the foregoing and following embodiments, the first layer is CrN or CrNiN, and the second layer is CrON. In one or more of the foregoing and following embodiments, the first layer is TaCo, and the second layer is TaCoO.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of making a semiconductor device, the method comprising:
   directing extreme ultraviolet (EUV) light to a reflective mask to reflect patterned EUV light onto a photoresist layer disposed on a target layer, the patterned EUV light selectively exposing the photoresist layer;
   developing the selectively exposed photoresist layer to form a patterned photoresist layer; and
   patterning the target layer using the patterned photoresist layer as a mask,
   wherein the reflective mask comprises:
      a substrate;
      a reflective multilayer disposed on the substrate;
      a capping layer disposed on the reflective multilayer; and
      an absorber layer disposed on the capping layer, the absorber layer including one or more alternately stacked pairs of a first Cr based layer and a second Cr based layer different from the first Cr based layer.

2. The method of claim 1, wherein an uppermost boundary of the absorber layer furthest from the substrate comprises the first Cr based layer, and the first Cr based layer comprises a CrN material.

3. The method of claim 2, wherein the CrN material comprises pure CrN.

4. The method of claim 2, wherein the CrN material comprises a mixture of $Cr_2N$ and CrN.

5. The method of claim 2, wherein the second Cr based layer comprises CrON.

6. The method of claim 5, wherein a ratio of O and N in the CrON is in a range from 0.2:0.8 to 0.8:0.2.

7. The method of claim 1, wherein an uppermost boundary of the absorber layer furthest from the substrate comprises the first Cr based layer, and the first Cr based layer comprises CrON.

8. The method of claim 7, wherein the second Cr based layer comprises a CrN material.

9. A method of making a semiconductor device, the method comprising:
   directing extreme ultraviolet (EUV) light to a reflective mask to reflect patterned EUV light onto a photoresist layer disposed on a target layer, the patterned EUV light selectively exposing the photoresist layer;
   developing the selectively exposed photoresist layer to form a patterned photoresist layer; and
   patterning the target layer using the patterned photoresist layer as a mask,
   wherein the reflective mask comprises:
      a substrate;
      a reflective multilayer disposed on the substrate;
      a capping layer disposed on the reflective multilayer; and
      an absorber layer disposed on the capping layer, the absorber layer including a layer stack including CrN layers alternately stacked with CrON layers, a layer stack including TaCo layers alternately stacked with TaCoO layers, or a layer stack including hafnium layers alternately stacked with hafnium oxide layers.

10. The method of claim 9, wherein the layer stack includes TaCo layers alternately stacked with TaCoO layers.

11. The method of claim 9, wherein the layer stack includes hafnium layers alternately stacked with hafnium oxide layers.

12. A method of making a semiconductor device, the method comprising:
   directing extreme ultraviolet (EUV) light to a reflective mask to reflect patterned EUV light onto a photoresist layer disposed on a target layer, the patterned EUV light selectively exposing the photoresist layer;
   developing the selectively exposed photoresist layer to form a patterned photoresist layer; and
   patterning the target layer using the patterned photoresist layer as a mask,
   wherein the reflective mask comprises:
      a substrate;

a reflective multilayer disposed on the substrate;
a capping layer disposed on the reflective multilayer; and
an absorber layer disposed on the capping layer, the absorber layer including one or more alternately stacked pairs of a first layer and a second layer, an etching rate of the first layer under an etching condition being different from an etching rate of the second layer under the etching condition.

13. The method of claim 12, wherein the first layer comprises a CrN material.

14. The method of claim 13, wherein the CrN material comprises pure CrN.

15. The method of claim 13, wherein the CrN material comprises a mixture of $Cr_2N$ and CrN.

16. The method of claim 13, wherein the second layer comprises CrON.

17. The method of claim 12, wherein the etching condition comprises plasma etching using a mixture of $O_2$ and a chlorine containing gas.

18. The method of claim 17, wherein the chlorine containing gas comprises at least one of $Cl_2$ and $CCl_4$.

19. The method of claim 12, wherein the etching condition comprises plasma etching using a mixture of $O_2$ with a fluorine containing gas.

20. The method of claim 19, wherein the fluorine containing gas comprises at least one of $CF_3H$ or $CF_4$.

* * * * *